US012580535B2

(12) United States Patent
Degani et al.

(10) Patent No.: US 12,580,535 B2
(45) Date of Patent: Mar. 17, 2026

(54) APPARATUS, SYSTEM, AND METHOD OF A MULTI-MODE POWER AMPLIFIER

(71) Applicant: INTEL CORPORATION, Santa Clara, CA (US)

(72) Inventors: Ofir Degani, Nes-Ammin (IL); Naor Roi Shay, Rehovot (IL); Assaf Ben-Bassat, Haifa (IL); Limor Zohar, Tel-Aviv (IL); Yishai Eilat, Alonei Aba (IL)

(73) Assignee: INTEL CORPORATION, Santa Clara, CA (US)

( * ) Notice: Subject to any disclaimer, the term of this patent is extended or adjusted under 35 U.S.C. 154(b) by 572 days.

(21) Appl. No.: 17/957,011

(22) Filed: Sep. 30, 2022

(65) Prior Publication Data

US 2024/0113670 A1 Apr. 4, 2024

(51) Int. Cl.
H03F 3/24 (2006.01)
H03F 3/45 (2006.01)
H04B 1/04 (2006.01)

(52) U.S. Cl.
CPC ......... H03F 3/245 (2013.01); H03F 3/45475 (2013.01); H04B 1/04 (2013.01); *H03F 2200/451* (2013.01); *H03F 2203/45018* (2013.01)

(58) Field of Classification Search
CPC ........ H03F 3/245; H03F 3/45475; H04B 1/04
See application file for complete search history.

(56) References Cited

U.S. PATENT DOCUMENTS

| | | | | |
|---|---|---|---|---|
| 6,577,187 | B1 * | 6/2003 | Lesko | H03F 3/45085 |
| | | | | 330/69 |
| 6,580,291 | B1 * | 6/2003 | Lutley | H03K 19/00315 |
| | | | | 326/63 |
| 9,438,240 | B1 * | 9/2016 | Gradinariu | G11C 16/06 |
| 11,073,857 | B1 * | 7/2021 | Liberti | H03K 19/018514 |
| 11,451,199 | B2 * | 9/2022 | Ripley | H01L 22/14 |
| 12,149,207 | B2 | 11/2024 | Degani et al. | |
| 2013/0079065 | A1 * | 3/2013 | Jo | H03F 1/56 |
| | | | | 455/571 |
| 2015/0155832 | A1 * | 6/2015 | Onizuka | H04L 25/03 |
| | | | | 330/251 |
| 2018/0123517 | A1 * | 5/2018 | Kim | H03F 1/0266 |
| 2021/0006217 | A1 * | 1/2021 | Yoo | H03F 1/0244 |
| 2022/0376657 | A1 | 11/2022 | Degani et al. | |
| 2023/0014555 | A1 * | 1/2023 | Liang | H03F 1/02 |
| 2023/0327618 | A1 | 10/2023 | Degani et al. | |

* cited by examiner

*Primary Examiner* — David Bilodeau
(74) *Attorney, Agent, or Firm* — Shichrur & Co.

(57) ABSTRACT

For example, an apparatus may include an input to receive an input signal in a first voltage domain; a multi-mode power amplifier switchable between a plurality of power modes to generate an output signal based on the input signal; and an output to provide the output signal. For example, the multi-mode power amplifier may be configured to provide the output signal in the first voltage domain at a first power mode, and to provide the output signal in a second voltage domain at a second power mode. For example, a maximal voltage of the second voltage domain may be at least two times a maximal voltage of the first voltage domain.

25 Claims, 11 Drawing Sheets

APPARATUS, SYSTEM, AND METHOD OF A MULTI-MODE POWER AMPLIFIER

TECHNICAL FIELD

Aspects described herein generally relate to a multi-mode power amplifier.

BACKGROUND

A power amplifier may be configured to amplify an input signal.

For example, the power amplifier may be implemented as part of a transmitter to amplify a signal to be transmitted.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
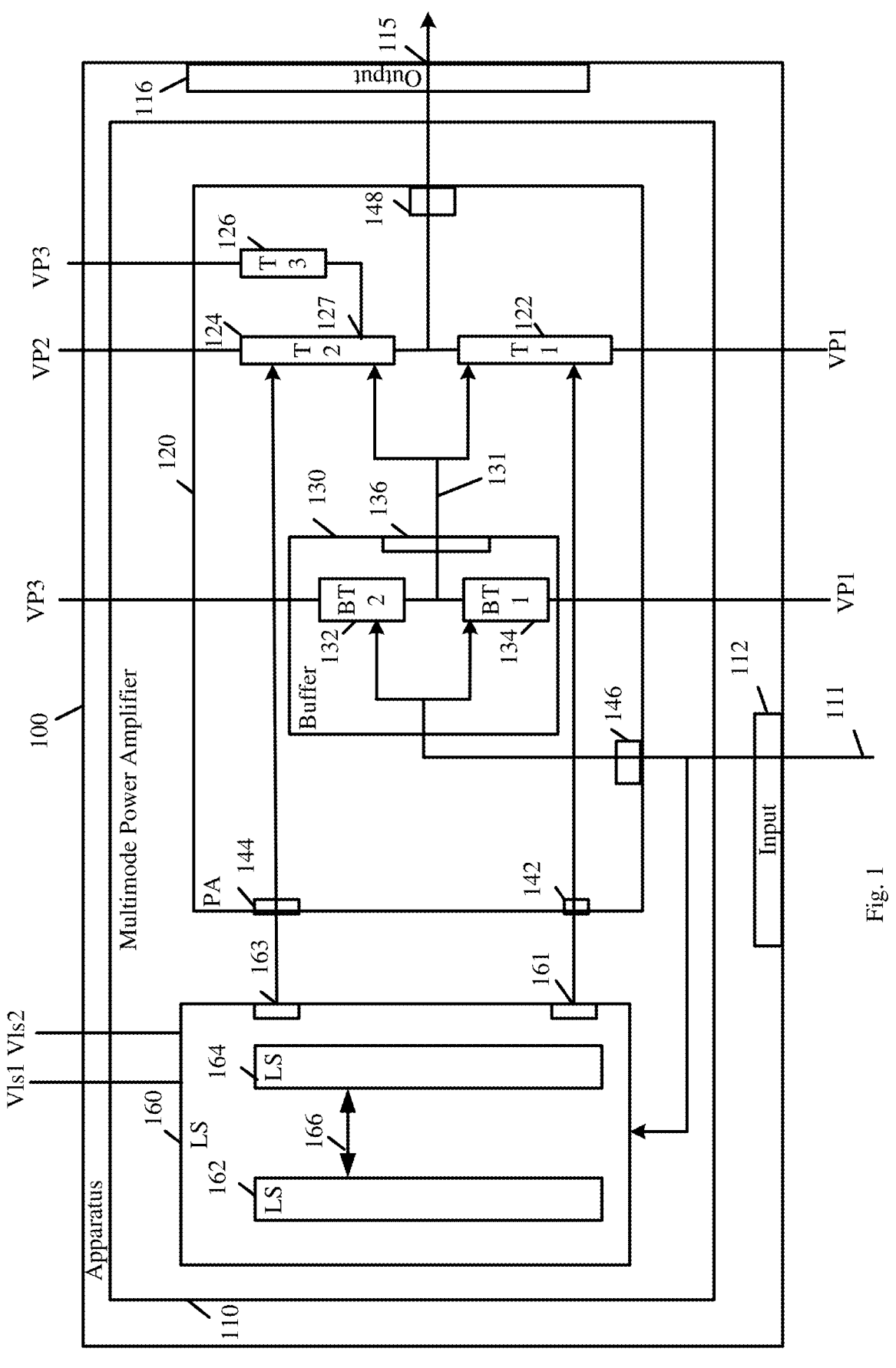
FIG. 1 is a schematic block diagram illustration of an apparatus, in accordance with some demonstrative aspects.

In the following detailed description, numerous specific details are set forth in order to provide a thorough understanding of some aspects. However, it will be understood by persons of ordinary skill in the art that some aspects may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a handheld device, a wearable device, a sensor device, an Internet of Things (IoT) device, a Bluetooth (BT) device, a Bluetooth Low Energy (BLE) device, an audio device, a video device, an audio (A/V) device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may be used in conjunction with devices and/or networks operating in accordance with existing IEEE 802.11 standards (including IEEE 802.11-2016 (IEEE 802.11-2016, *IEEE Standard for Information technology— Telecommunications and information exchange between systems Local and metropolitan area networks—Specific requirements Part* 11: *Wireless LAN Medium Access Control* (*MAC*) *and Physical Layer* (*PHY*) *Specifications*, Dec. 7, 2016)), and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, wireless communication systems, cellular radio-telephone communication systems, a mobile phone, a cellular telephone, a wireless telephone, a Bluetooth system, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), Extended GPRS, Code-Division Multiple Access (CDMA), Wideband CDMA (WCDMA), CDMA 2000, single-carrier CDMA, multi-carrier CDMA, Multi-Carrier Modulation (MCM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE Advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, some functions associated with the circuitry may be implemented by, one or more software or firmware modules. In some aspects, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

Some demonstrative aspects may be used in conjunction with a WLAN, e.g., a WiFi network, and/or a cellular network, e.g., a 5G network. Other aspects may be used in conjunction with any other suitable wireless communication network, for example, a wireless area network, a "piconet", a WPAN, a WVAN, and the like.

Some demonstrative aspects may be used in conjunction with a wireless communication network communicating over a frequency band of 2.4 GHz, 5 GHz, or 6 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

Reference is made to FIG. 1, which schematically illustrates an apparatus 100, in accordance with some demonstrative aspects.

In some demonstrative aspects, apparatus 100 may be implemented as part of a communication device, e.g., as described below.

In some demonstrative aspects, apparatus 100 may be implemented as part of a communication interface, e.g., as described below.

In some demonstrative aspects, apparatus 100 may be implemented as part of a transmitter, e.g., as described below.

In other aspects, apparatus 100 may be implemented as part of any other device, element and/or component, e.g., as described below.

In some demonstrative aspects, apparatus 100 may include a multi-mode Power Amplifier (PA) 110, for example, a multi-mode Digital PA (DPA), e.g., as described below.

In some demonstrative aspects, multi-mode PA 110 may be configured to amplify and output an input signal at a plurality of power modes.

In one example, the plurality of power modes may include a high output power mode, a middle output power mode, and a low output power mode, and/or any other additional or alternative power modes.

In some demonstrative aspects, multi-mode PA 110 may be implemented to provide a technical solution to support the plurality of power modes, for example, while keeping high efficiency for some or all of the plurality of power modes.

In some demonstrative aspects, multi-mode PA 110 may be implemented to provide a technical solution to support a plurality of power modes corresponding to a plurality of wireless communication interfaces, e.g., as described below.

In some demonstrative aspects, multi-mode PA 110 may be implemented to provide a technical solution to support a first power mode corresponding to a first wireless communication interface utilizing a first wireless communication technology, e.g., Bluetooth; and to support a second power mode corresponding to a second wireless communication interface utilizing a second wireless communication technology, e.g., WiFi, e.g., as described below.

In one example, multi-mode PA 110 may be configured to support a BT power mode for BT communications, and a WiFi power mode for WiFi communications. For example, multi-mode PA 110 may be configured to provide a technical solution to support the BT power mode and the WiFi power mode on a same core, for example, while keeping high efficiency for both power modes. For example, the BT power mode may be configured to provide a power level of milliwatts (mW), e.g., a maximal power (Pmax) of about 600 mW (18-20 dBm) and/or any other power level. For example, the WiFi power mode may be configured to provide a power level of about one Watt, e.g., Pmax ~0.5-1 W (28-30 dBm), and/or any other power level.

In some demonstrative aspects, in some use cases, and/or scenarios, there may be one or more technical inefficiencies, disadvantages and/or problems in implementing a single-power-mode PA, e.g., as described below.

In one example, a single-power-mode PA, which is designed for a first power mode, may not be suitable to support a second power mode, and/or may not be efficient in the second power mode.

In some demonstrative aspects, in some use cases, and/or scenarios, there may be one or more technical inefficiencies, disadvantages and/or problems in implementing a high backoff (BO) single-power-mode PA, which may be operated at a high backoff, for example, to provide a plurality of power modes. For example, the high backoff may be utilized, for example, to support a low power output.

In one example, operating the single-power-mode PA at the high BO may result in low efficiency, e.g., at the low power mode, and/or may require extra bits and/or dynamic range to support Signal to Noise Ratio (SNR) at the high power mode and the low power mode. For example, operating the single power-mode PA at high BO to support the BT power mode, e.g., at a large BO may result in poor efficiency.

In some demonstrative aspects, in some use cases, and/or scenarios, there may be one or more technical inefficiencies, disadvantages and/or problems in implementations using several PAs connected to a same node by a switch, e.g., a Single Pole Double Throw (SPDT) switch, for example, to support a plurality of power modes.

In one example, these implementations of multiple PAs may result in output power loss, for example, due to mutual loading effects of the PAs, and/or due to switch insertion losses.

In another example, these implementations of multiple PAs may result in high area and/or high power losses, which may increase cost.

In some demonstrative aspects, in some use cases, and/or scenarios, there may be one or more technical inefficiencies, disadvantages and/or problems in implementations for supporting multiple power modes based on combining non-symmetrical cores, which may enhance efficiency, e.g., in a preferred BO.

In one example, the implementations based on the combining of the non-symmetrical cores may require using a plurality of non-symmetrical cores, which may result in high power loss, and/or high area, which may increase cost.

In some demonstrative aspects, multi-mode power amplifier 110 may be switchable between a plurality of power modes, e.g., as described below.

In some demonstrative aspects, the multi-mode power amplifier 110 may be configured to support, for example, a low power mode, a middle power mode, and/or a high power mode, e.g., as described below.

In other aspects, the multi-mode power amplifier 110 may be configured to support any other additional or alternative power modes.

In one example, multi-mode power amplifier 110 may be configured to support, for example, a BT output power and/or a WiFi output power, for example, on a same core, for example, while keeping high efficiency for both of the power outputs, e.g., as described below.

In some demonstrative aspects, multi-mode power amplifier 110 may be configured to support, for example, a plurality of voltage domains, e.g., as described below.

In one example, multi-mode power amplifier 110 may be configured to support, for example, a plurality of power modes corresponding to a plurality of voltage domains, e.g., as described below.

In some demonstrative aspects, multi-mode power amplifier 110 may be configured to support, for example, a first voltage domain of a first power mode, and/or a second voltage domain of a second power mode, e.g., as described below.

For example, the second voltage domain may be different from the first voltage domain, and/or the second power mode may be different from the first power mode, e.g., as described below.

In some demonstrative aspects, multi-mode power amplifier 110 may be configured to support, for example, a first voltage domain of a power mode, and a second voltage domain of the same power mode, e.g., as described below.

For example, the second voltage domain of the power mode may be different from the first voltage domain of the power mode, e.g., as described below.

In some demonstrative aspects, multi-mode power amplifier 110 may be configured to support, for example, a maximal voltage of a first voltage domain, which may be at least two times a maximal voltage of a second voltage domain, e.g., as described below.

In some demonstrative aspects, multi-mode power amplifier 110 may be configured to support, for example, a maximal voltage of a first voltage domain, which may be at least three times a maximal voltage of a second voltage domain, e.g., as described below.

Some demonstrative aspects are described below with respect to a multi-mode power amplifier, e.g., multi-mode power amplifier 110, which may be configured to support a maximal voltage of a first voltage domain, which may be at least three times a maximal voltage of a second voltage domain, e.g., as described below. Other aspects may be implemented with respect to a multi-mode power amplifier, e.g., multi-mode power amplifier 110, which may be configured to support a maximal voltage of a first voltage domain, which may be m times a maximal voltage of a second voltage domain, wherein m is any suitable value greater than 2.

In other aspects, multi-mode power amplifier 110 may be configured to support any other additional or alternative voltages of any other additional or alternative voltage domains.

In one example, a maximum voltage, denoted Vd,max, for a circuitry technology may be defined based on a maximal voltage allowed to be applied to a circuitry element, e.g., a transistor, in circuitry implemented according to the circuitry technology. According to this example, multi-mode power amplifier 110 may be configured to support, for example, a first maximal voltage, denoted Vdd1, of a first voltage domain, which may be equal to the Vd,max voltage level, e.g., Vdd1=Vd,max, and one or more other maximal voltages which may be higher than the maximal voltage Vd,max. For example, multi-mode power amplifier 110 may be configured to support a second maximal voltage, denoted Vdd2, of a second voltage domain, which may be about three times the first maximal voltage, e.g., Vdd2=3×Vd,max.

In some demonstrative aspects, multi-mode power amplifier 110 may be configured to support a plurality of supply voltages, e.g., as described below.

For example, two different supply voltages may be applied to a core of multi-mode power amplifier 110, e.g., as described below.

In one example, multi-mode power amplifier 110 may be configured to support, for example, a first supply voltage of a first voltage domain, which may be about the maximum voltage Vd,max, and a second supply voltage of a second voltage domain, which may be about 3×Vd,max, e.g., as described below.

In some demonstrative aspects, multi-mode power amplifier 110 may be configured to provide a technical solution to support an implementation, which may substantially not change and/or influence an output net of multi-mode power amplifier 110, which may allow to keep a substantially same matching network, and/or which may allow to achieve efficiency boosting in a plurality of power modes, e.g., as described below.

In some demonstrative aspects, multi-mode power amplifier 110 may be configured to provide a technical solution to support using even only a single PA, e.g., a DPA. This technical solution may support a lower die area, e.g., as described below.

In some demonstrative aspects, multi-mode power amplifier 110 may be configured to provide a technical solution to support efficient boosting, e.g., even at high back-off, as described below.

In some demonstrative aspects, multi-mode power amplifier 110 may be configured to provide a technical solution to support an implementation, which avoids a technical issue of loading, e.g., from mutual loading of several DPAs on a same node.

In some demonstrative aspects, apparatus 100 may include an input 112 to receive an input signal 111 in a first voltage domain, e.g., as described below.

In some demonstrative aspects, multi-mode power amplifier 110 may be switchable between a plurality of power modes, for example, to generate an output signal 115, for example, based on the input signal 111, e.g., as described below.

In some demonstrative aspects, apparatus 100 may include an output 116 to provide the output signal 115, e.g., as described below.

In some demonstrative aspects, multi-mode power amplifier 110 may be configured to provide the output signal 115 in the first voltage domain at a first power mode, e.g., as described below.

In some demonstrative aspects, multi-mode power amplifier 110 may be configured to provide the output signal 115 in a second voltage domain at a second power mode, e.g., as described below.

In some demonstrative aspects, a maximal voltage of the second voltage domain may be at least two times a maximal voltage of the first voltage domain, e.g., as described below.

In some demonstrative aspects, the maximal voltage of the second voltage domain may be at least three times the maximal voltage of the first voltage domain, e.g., as described below.

In other aspects, the maximal voltage of the second voltage domain may include any other voltage greater than the maximal voltage of the first voltage domain.

In one example, the first power mode may include a low power mode in a first voltage domain between 0-1V; and/or the second power mode may include a high power mode in a second voltage domain between 0-3V.

In another example, the first power mode and/or the second power mode may include any other modes in any other voltage domains.

In some demonstrative aspects, multi-mode power amplifier 110 may include a Level Shifter (LS) 160 configured to provide a first LS output at the first power mode, and/or to provide a second LS output at the second power mode, e.g., as described below.

In some demonstrative aspects, the second LS output may be based on the input signal 111, e.g., as described below.

In some demonstrative aspects, multi-mode power amplifier 110 may include Power-Amplifier (PA) circuitry 120, e.g., as described below.

In some demonstrative aspects, PA circuitry 120 may be configured to generate the output signal 115 at the first power mode, for example, based on the input signal 111 and the first LS output, e.g., as described below.

In some demonstrative aspects, PA circuitry 120 may be configured to generate the output signal 115 at the second power mode, for example, based on the second LS output, e.g., as described below.

In some demonstrative aspects, the first LS output, e.g., at the first power mode, may include a first LS output voltage at a first output node 161 of the LS 160, e.g., as described below.

In some demonstrative aspects, the first LS output, e.g., at the first power mode, may include a second LS output voltage at a second output node 163 of the LS 160, e.g., as described below.

In some demonstrative aspects, the first LS output voltage may include a first supply voltage, denoted Vls1, of the LS 160, and/or the second LS output voltage may include a second supply voltage, denoted Vls2, of the LS 160, e.g., as described below.

In some demonstrative aspects, the first LS output voltage may include the maximal voltage of the first voltage domain, and/or the second LS output voltage may include the maximal voltage of the second voltage domain, e.g., as described below.

In some demonstrative aspects, the second LS output, e.g., at the second power mode, may include a first LS output signal at the first output node 161 of the LS 160, for example, based on the input signal 111, e.g., as described below.

In some demonstrative aspects, the second LS output, e.g., at the second power mode, may include a second LS output signal at the second output node 163 of the LS 160, for example, based on the input signal 111, e.g., as described below.

In some demonstrative aspects, the first LS output signal may be in a first LS output voltage range, and/or the second LS output signal may be in a second LS output voltage range, which may be different from the first LS output voltage range, e.g., as described below.

In some demonstrative aspects, a size of the first LS output voltage range may be equal to a size of the second LS output voltage range, e.g., as described below.

In some demonstrative aspects, the size of the first LS output voltage range and/or the size of the second LS output voltage range may be based, for example, on a size of a voltage range of the first voltage domain, e.g., as described below.

In some demonstrative aspects, a maximal voltage of the first LS output voltage range may include the maximal voltage of the first voltage domain, e.g., as described below.

In some demonstrative aspects, a maximal voltage of the second LS output voltage range may include the maximal voltage of the second voltage domain, e.g., as described below.

In one example, the maximal voltage of the first LS output voltage range may include the first supply voltage Vls1, and/or the maximal voltage of the second LS output voltage range may include the second supply voltage Vls2, e.g., as described below.

In some demonstrative aspects, a minimal voltage of the first LS output voltage range may include a minimal voltage of the first voltage domain, e.g., as described below.

In some demonstrative aspects, a minimal voltage of the second LS output voltage range may include a difference between the maximal voltage of the second voltage domain and a size of a voltage range of the first voltage domain, e.g., as described below.

In one example, the first voltage domain may be in a voltage range of 0-1V, and the second voltage domain may be in a voltage range of 0-3V. According to this example, the first LS output signal may be in a voltage range of 0-1V, and/or the second LS output signal may be in a voltage range of 2-3V, for example, which may be based, for example, on the voltage range 0-1V of the first voltage domain.

In other aspects, any other first LS output voltage range and/or second LS output voltage range may be used.

In some demonstrative aspects, the LS 160 may include first LS circuitry 162, second LS circuitry 164, and a cross-coupling connection 166 switchable between a coupling mode and a de-coupling mode, e.g., as described below.

In some demonstrative aspects, for example, at the first power mode, the cross-coupling connection 166 may be operable at the de-coupling mode, for example, to electrically decouple between the first LS circuitry 162 and the second LS circuitry 164, e.g., as described below.

In some demonstrative aspects, for example, at the second power mode, the cross-coupling connection 166 may be operable at the coupling mode, for example, to electrically couple between the first LS circuitry 162 and the second LS circuitry 164. For example, the cross-coupling connection 166 may electrically couple between the first LS circuitry 162 and the second LS circuitry 164 to provide the second LS output of the LS 160, for example, as a differential LS output, e.g., as described below.

In one example, the differential LS output may include, for example, a plurality of first LS output signals and a plurality of second LS output signals, which are opposite to the plurality of first LS output signals. For example, a first LS output signal, which is opposite to a second LS output signal, may include a "0" signal, for example, when the second LS output signal includes a "1" signal.

In some demonstrative aspects, PA circuitry 120 may include a first input node 142 connected to the first output node 161 of the LS 160, e.g., as described below.

In some demonstrative aspects, PA circuitry 120 may include a second input node 144 connected to the second output node 163 of the LS 160, e.g., as described below.

In some demonstrative aspects, PA circuitry 120 may include an output node 148 configured to provide the output signal 115, e.g., as described below.

In some demonstrative aspects, PA circuitry 120 may include a first plurality of transistors 122 connected in series between a first PA voltage, denoted Vp1, and the output node 148, e.g., as described below.

In some demonstrative aspects, a gate of a transistor of the first plurality of transistors 122 may be connected to the first input node 142, e.g., as described below.

In some demonstrative aspects, PA circuitry 120 may include a second plurality of transistors 124 connected in series between a second PA voltage, denoted Vp2, and the output node 148, e.g., as described below.

In some demonstrative aspects, a gate of a transistor of the second plurality of transistors 124 may be connected to the second input node 144, e.g., as described below.

In some demonstrative aspects, PA circuitry 120 may be configured to provide the output signal 115 in the second voltage domain at the second power mode, for example, based on the first LS output signal at the first input node 142 and/or the second LS output signal at the second input node 144, e.g., as described below.

In some demonstrative aspects, the first plurality of transistors 122 and/or the second plurality of transistors 124 may be configured to provide the maximal voltage of the second power domain at the output node 148, for example, based on the minimal voltage of the first LS output signal at the first input node 142, for example, from output node 161, and/or based on the minimal voltage of the second LS output signal at the second input node 144, for example, from output node 163, e.g., as described below.

In some demonstrative aspects, the first plurality of transistors 122 and/or the second plurality of transistors 124 may be configured to provide the minimal voltage of the second power domain at the output node 148, for example, based on the maximal voltage of the first LS output signal at the first input node 142, for example, from output node 161, and/or based on the maximal voltage of the second LS output signal at the second input node 144, for example, from output node 163, e.g., as described below.

In some demonstrative aspects, PA circuitry 120 may include a third input node 146 to input the input signal 111, for example, at the first power mode, e.g., as described below.

In some demonstrative aspects, PA circuitry 120 may be configured to provide the output signal 115 in the first voltage domain at the first power mode, for example, based on the input signal 111 at the third input node 146, the first LS output voltage at the first input node 142, for example, from output node 161, and/or the second LS output voltage at the second input node 144, for example, from output node 163, e.g., as described below.

In some demonstrative aspects, PA circuitry 120 may be configured to provide the maximal voltage of the first power domain at the output node 148, for example, based on a minimal voltage of the input signal 111 at the third input node 146, e.g., as described below.

In some demonstrative aspects, PA circuitry 120 may be configured to provide the minimal voltage of the first power domain at the output node 148, for example, based on a maximal voltage of the input signal 111 at the third input node 146, e.g., as described below.

In some demonstrative aspects, multi-mode power amplifier 110 may include buffer circuitry 130 configured to provide a buffered input signal 131 to a gate of a first transistor and to a gate of a second transistor of PA circuitry 120, for example, at the first power mode, e.g., as described below.

In some demonstrative aspects, the first transistor may be in the first plurality of transistors 122, and/or the second transistor may be in the second plurality of transistors 124, e.g., as described below.

In some demonstrative aspects, buffer circuitry 130 may include a first plurality of buffer transistors 132 connected in series between a third PA voltage, denoted Vp3, and a buffer output node 136 of the buffer circuitry 130, e.g., as described below.

In some demonstrative aspects, the third PA voltage Vp3 may include the maximal voltage of the first voltage domain, e.g., as described below.

In some demonstrative aspects, buffer circuitry 130 may include a second plurality of buffer transistors 134 connected in series between the first PA voltage Vp1 and the buffer output node 136, e.g., as described below.

In some demonstrative aspects, the third input node 146 may be connected to a gate of a transistor of the first plurality of buffer transistors 132 and to a gate of a transistor of the second plurality of buffer transistors 134, e.g., as described below.

In some demonstrative aspects, the buffer circuitry 130 may be operable as a high-impedance capacitor to apply a high-impedance capacitance to the third input node 146, for example, at the second power mode, e.g., as described below.

In some demonstrative aspects, PA circuitry 120 may include a third plurality of transistors 126 connected in series between the third PA voltage Vp3 and a transistor node 127 between first and second transistors in the plurality of transistors 124, e.g., as described below.

In some demonstrative aspects, the third plurality of transistors 126 may be configured to provide the third PA voltage Vp3 to the transistor node 127, for example, at the first power mode, e.g., as described below.

In some demonstrative aspects, the PA voltage Vp1 may include the minimal voltage of the first and second power mode, the PA voltage Vp2 may include the maximal voltage of the second power mode, and/or the PA voltage Vp3 may include the maximal voltage of the first power mode, e.g., as described below.

Figure 2:
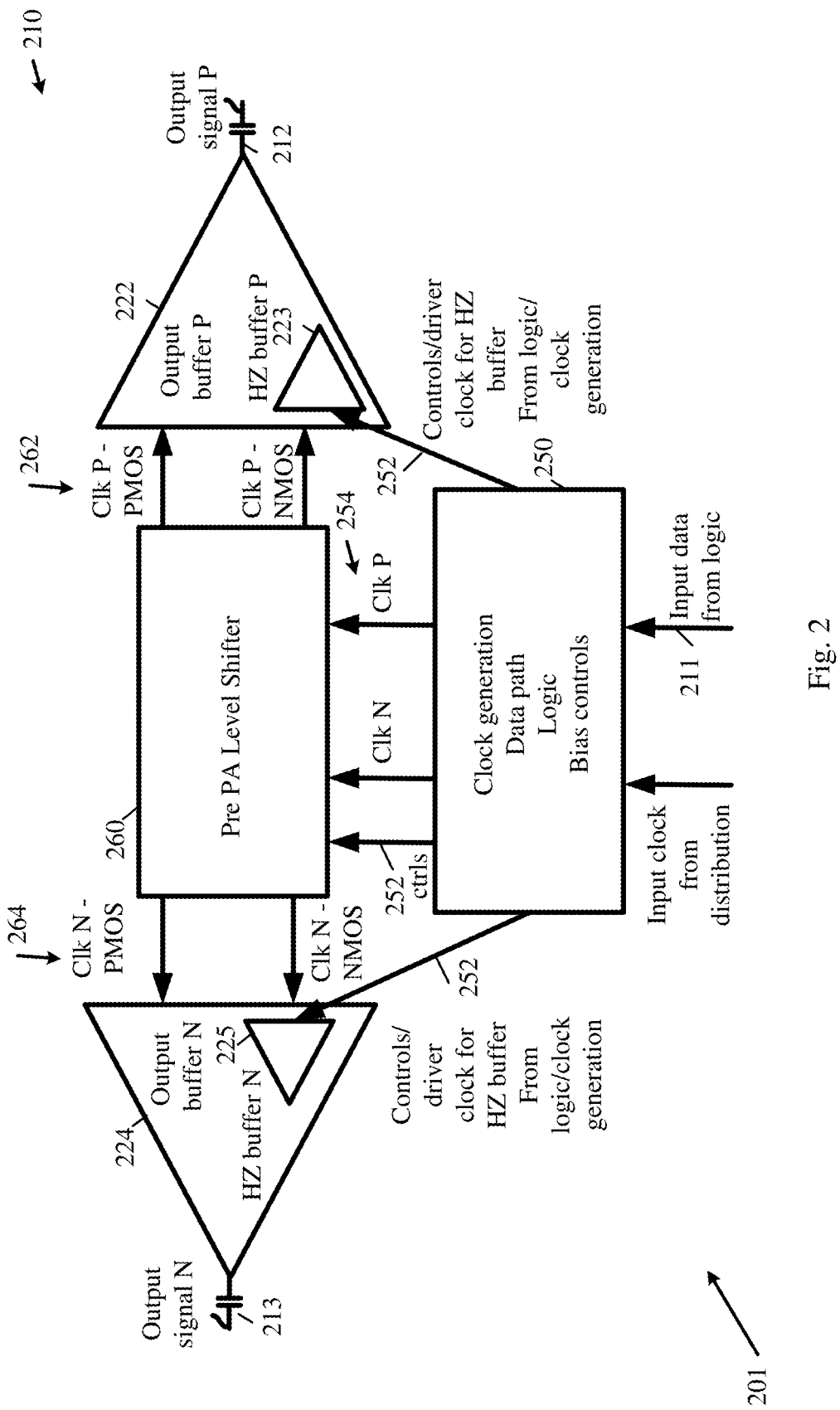
FIG. 2 is a schematic illustration of a system including a multi-mode power amplifier and a controller, in accordance with some demonstrative aspects.

Reference is made to FIG. 2, which schematically illustrates a system 201 including a multi-mode power amplifier 210 and a controller 250, in accordance with some demonstrative aspects. For example, multi-mode power amplifier 210 may include one or more elements of multi-mode power amplifier 110 (FIG. 1), and/or may perform one or more operations of multi-mode power amplifier 110 (FIG. 1).

In some demonstrative aspects, multi-mode power amplifier 210 may be switchable, for example, by controller 250, between a plurality of power modes, for example, to generate a positive output signal 212 and a negative output signal 213, for example, based on an input signal 211.

In some demonstrative aspects, negative output signal 213 may be opposite to the positive output signal 212. For example, when negative output signal 213 includes "0", the positive output signal 212 may include "1", and vice versa.

In some demonstrative aspects, as shown in FIG. 2, multi-mode power amplifier 210 may include a LS 260, which may be configured to provide a first LS output at a first power mode, and a second LS output at a second power mode. For example, LS 260 may include one or more elements of LS 160 (FIG. 1), and/or may perform one or more operations of LS 160 (FIG. 1).

In some demonstrative aspects, as shown in FIG. 2, multi-mode power amplifier 210 may include first PA circuitry 222 configured to generate the positive output signal 212. For example, PA circuitry 222 may include one or more elements of PA circuitry 120 (FIG. 1), and/or may perform one or more operations of PA circuitry 120 (FIG. 1).

In some demonstrative aspects, as shown in FIG. 2, multi-mode power amplifier 210 may include second PA circuitry 224 configured to generate the negative output signal 213. For example, PA circuitry 224 may include one or more elements of PA circuitry 120 (FIG. 1), and/or may perform one or more operations of PA circuitry 120 (FIG. 1).

In some demonstrative aspects, PA circuitry 224 and PA circuitry 222 may be implemented according to a similar architecture, e.g., PA circuitry 224 and PA circuitry 222 may include substantially the same circuitry.

In some demonstrative aspects, as shown in FIG. 2, PA circuitry 222 may include buffer circuitry 223. For example, buffer circuitry 223 may include one or more elements of buffer circuitry 130 (FIG. 1), and/or may perform one or more operations of buffer circuitry 130 (FIG. 1).

In some demonstrative aspects, as shown in FIG. 2, PA circuitry 224 may include buffer circuitry 225. For example, buffer circuitry 225 may include one or more elements of buffer circuitry 130 (FIG. 1), and/or may perform one or more operations of buffer circuitry 130 (FIG. 1).

In some demonstrative aspects, as shown in FIG. 2, controller 250 may be configured to control the multi-mode power amplifier 210, for example, by control signals 252, which may be provided to LS 260, to PA circuitry 222, and/or to PA circuitry 224.

In some demonstrative aspects, controller 250 may be configured to trigger, cause, instruct and/or control the multi-mode power amplifier 210 to perform one or more functionalities, operations and/or procedures, e.g., as described herein.

In some demonstrative aspects, controller 250 may include, or may be implemented, partially or entirely, by circuitry and/or logic, e.g., one or more processors including circuitry and/or logic, memory circuitry and/or logic, and/or any other circuitry and/or logic, configured to perform the functionality of controller 250. Additionally or alternatively, one or more functionalities of controller 250 may be implemented by logic, which may be executed by a machine and/or one or more processors, e.g., as described below.

In one example, controller 250 may include circuitry and/or logic, for example, one or more processors including circuitry and/or logic, to cause, trigger and/or control a multi-mode power amplifier, e.g., multi-mode power amplifier 210, to perform one or more operations, and/or functionalities, e.g., as described herein. In one example, controller 250 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative aspects, as shown in FIG. 2, controller 250 may be configured to provide input signals 254 to LS 260, for example, based on input signal 211.

In some demonstrative aspects, as shown in FIG. 2, LS 260 may be configured to provide to PA circuitry 222 first LS outputs 262 at first output nodes of the LS 260, for example, based on input signals 254.

In some demonstrative aspects, as shown in FIG. 2, LS 260 may be configured to provide to PA circuitry 224 second LS outputs 264 at second output nodes of the LS 260, for example, based on input signals 254.

In some demonstrative aspects, PA circuitry 222 may be configured to generate the positive output signal 212, for example, based on the first outputs 262.

In some demonstrative aspects, PA circuitry 224 may be configured to generate the negative output signal 213, for example, based on the second outputs 264.

Figure 3A:
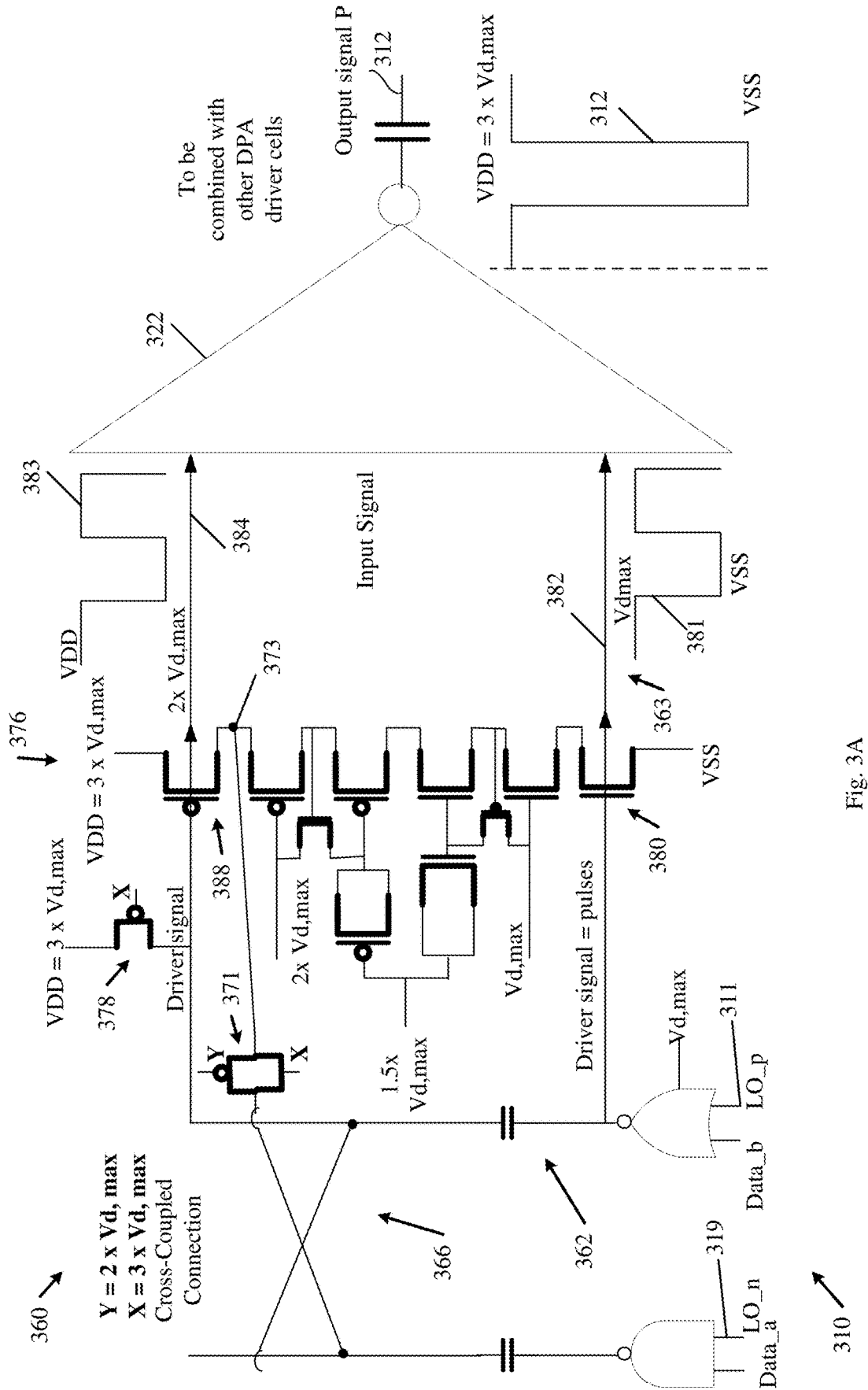
FIGS. 3A, 3B, and 3C are schematic illustrations of a multi-mode power amplifier at a high-power mode, in accordance with some demonstrative aspects.
Figure 3B:
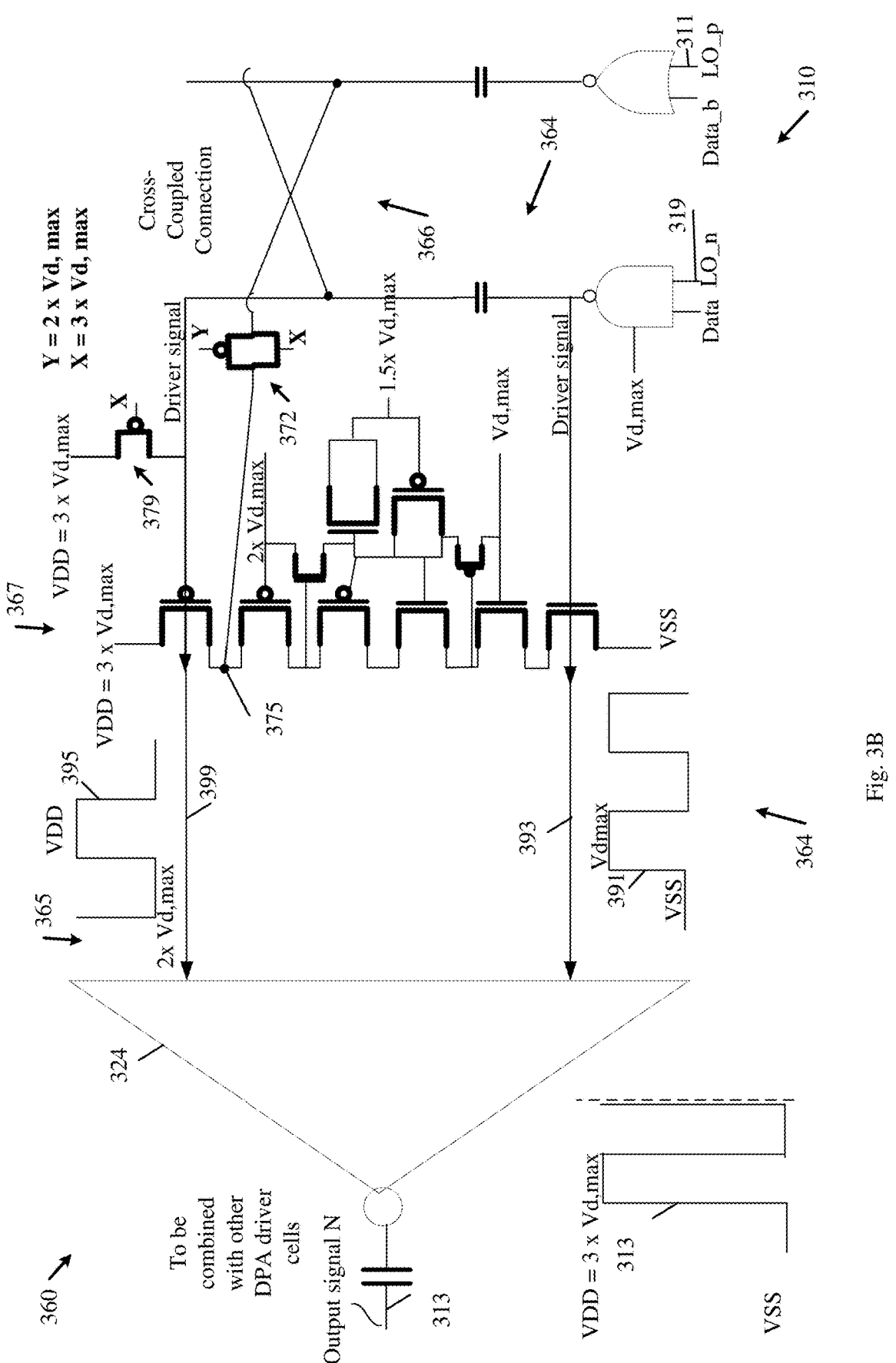
Figure 3C:
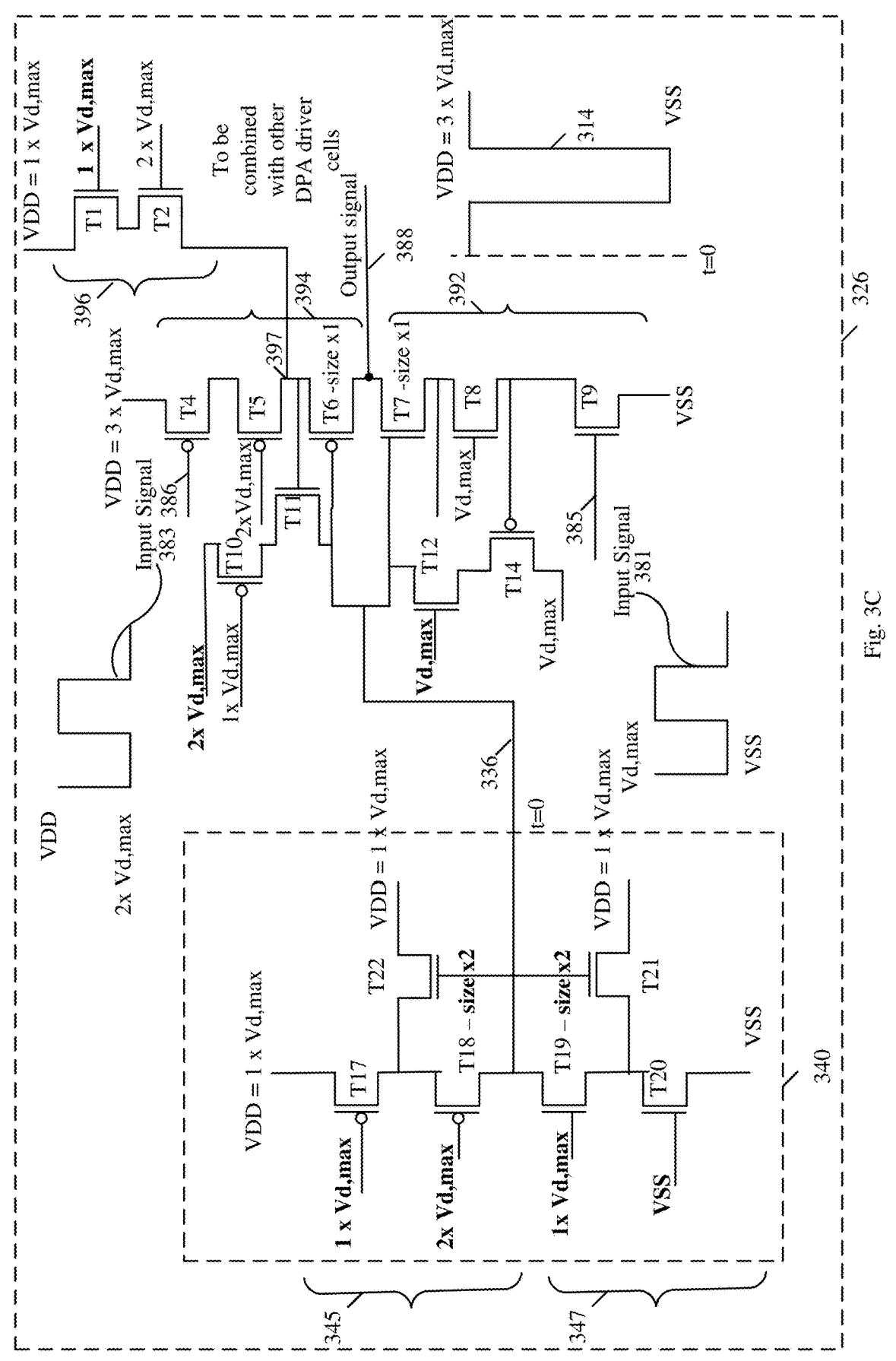

Reference is made to FIG. 3A, FIG. 3B, and FIG. 3C, which schematically illustrate a multi-mode power amplifier 310 at a high power mode. For example, multi-mode power amplifier 210 (FIG. 2) may include one or more elements of multi-mode power amplifier 310, and/or may perform one or more operations of multi-mode power amplifier 310.

In some demonstrative aspects, multi-mode power amplifier 310 may be switchable between the high power mode and a low power mode, for example, by a controller, e.g., controller 250 (FIG. 2).

In some demonstrative aspects, the low power mode may have a voltage range between a Voltage Source Supply (VSS), e.g., a Ground voltage or a '0' voltage level, and the maximal voltage Vd,max, e.g., 1 Volt or any other voltage.

In some demonstrative aspects, the high power mode may have a voltage range between the VSS and a Drain Voltage (VDD) voltage level, which may be higher than the maximal voltage level Vd,max, e.g., as described below.

In some demonstrative aspects, the high power mode may have a voltage range between the VSS and the VDD including three times the maximal voltage level Vd,max, e.g., VDD=3×Vd,max, e.g., 3 Volt, or any other voltage. Accordingly, the low power mode may have the voltage range between 0-1V, and/or the high power mode may have the voltage range between 0-3V.

In other aspects, any other voltage ranges may be implemented for the low power mode and/or the high power mode.

In some demonstrative aspects, multi-mode power amplifier 310 may be configured to generate, e.g., at the high power mode, a positive high power output signal 312 and a negative high-power output signal 313, which may be opposite to the positive high power output signal 312.

In some demonstrative aspects, as shown in FIGS. 3A and 3B, multi-mode power amplifier 310 may include an LS 360. For example, LS 260 (FIG. 2) may include one or more elements of LS 360, and/or may perform one or more operations of LS 360.

In some demonstrative aspects, LS 360 may be configured to provide a high power LS output at the high power mode, and the low-power LS output at the low power mode, e.g., as described below.

In some demonstrative aspects, as shown in FIG. 3A, multi-mode power amplifier 310 may include first PA circuitry 322. For example, PA circuitry 322 may include one or more elements of PA circuitry 120 (FIG. 1), and/or may perform one or more operations of PA circuitry 120 (FIG. 1).

In some demonstrative aspects, as shown in FIG. 3A, first PA circuitry 322 may be configured to generate the positive high-power output signal 312, for example, based on a positive input signal 311.

In some demonstrative aspects, as shown in FIG. 3B, multi-mode power amplifier 310 may include second PA circuitry 324. For example, PA circuitry 324 may include one or more elements of PA circuitry 120 (FIG. 1), and/or may perform one or more operations of PA circuitry 120 (FIG. 1).

In some demonstrative aspects, as shown in FIG. 3B, second PA circuitry 324 may be configured to generate the negative high-power output signal 313, for example, based on a negative input signal 319, which may be opposite to the positive input signal 311.

In some demonstrative aspects, first PA circuitry 322 and second PA circuitry 324 may have a same architecture and/or may include substantially similar circuitry, e.g., as described below.

In some demonstrative aspects, first PA circuitry 322 and second PA circuitry 324 may include PA circuitry 326. For example, first PA circuitry 322 and second PA circuitry 324 may have the architecture of PA circuitry 326.

In some demonstrative aspects, as shown in FIGS. 3A and 3B, LS 360 may include first LS circuitry 362, second LS circuitry 364, and a cross-coupling connection 366 switchable between a coupling mode and a de-coupling mode, e.g., as described below.

In some demonstrative aspects, as shown in FIG. 3A, LS circuitry 362 may be configured to provide to PA circuitry 322 first LS outputs 363 at first output nodes of the LS 360.

In some demonstrative aspects, as shown in FIG. 3B, LS circuitry 364 may be configured to provide to PA circuitry 324 second LS outputs 365 at second output nodes of the LS 360.

In some demonstrative aspects, as shown in FIGS. 3A and 3B, at the high power mode, the cross-coupling connection 366 may be operable at the coupling mode to electrically couple between the first LS circuitry 362 and the second LS circuitry 364, for example, to provide the high power LS output of the LS 360, for example, as a differential LS output, e.g., as described below.

In some demonstrative aspects, LS 360 may be configured to provide the differential LS output, for example, to include first LS outputs 363 and second LS outputs 365, which may be opposite to first LS outputs 363.

In some demonstrative aspects, as shown in FIGS. 3A and 3B, cross-coupling connection 366 may be configured, for example, by a first switch 371 in LS circuitry 362, and a second switch 372 in LS circuitry 364, to electrically couple between the first LS circuitry 362 and the second LS circuitry 364.

In some demonstrative aspects, as shown in FIGS. 3A and 3B, switch 371 and/or switch 372 may include an NMOS transistor and a PMOS transistor connected in parallel.

In other aspects, switch 371 and/or switch 372 may include any other types of switches.

In some demonstrative aspects, switch 371 and/or switch 372 may be at an open state, for example, when there is a positive difference between a gate of the NMOS transistor and a gate of the PMOS transistor.

In some demonstrative aspects, switch 371 and/or switch 372 may be at a closed state, for example, when there is a negative difference between the gate of the NMOS transistor and the gate of the PMOS transistor.

In some demonstrative aspects, as shown in FIGS. 3A and 3B, the gate of the NMOS transistor may receive an input, denoted X, including a voltage level of three times the Vd,max voltage level, e.g., X=3×Vd,max.

In some demonstrative aspects, as shown in FIGS. 3A and 3B, the gate of the PMOS transistor may receive an input, denoted Y, including a voltage level of two times the Vd,max voltage level, e.g., Y=2×Vd,max.

Accordingly, switch 371 and/or switch 372 may be at the open state.

In some demonstrative aspects, as shown in FIG. 3A, switch 371 may be configured to provide negative input signal 319 to a transistor node 373 between first and second transistors in a plurality of transistors 376 of LS circuitry 362.

In some demonstrative aspects, as shown in FIG. 3B, switch 372 may be configured to provide positive input signal 311 to a transistor node 375 between first and second transistors in a plurality of transistors 367 of LS circuitry 364.

In some demonstrative aspects, as shown in FIG. 3A, LS circuitry 362 may include a transistor 378.

In some demonstrative aspects, as shown in FIGS. 3A, a gate of transistor 378 may receive the input X including the 3×Vd,max voltage level. Accordingly, transistor 378 may be at a closed state, e.g., when a source of transistor 378 receives the 3×Vd,max voltage level.

In some demonstrative aspects, as shown in FIGS. 3B, LS circuitry 364 may include a transistor 379.

In some demonstrative aspects, as shown in FIGS. 3B, a gate of transistor 379 may receive the input X including the 3×Vd,max voltage level. Accordingly, transistor 379 may be at a closed state, e.g., when a source of transistor 379 receives the 3×Vd,max voltage level.

In some demonstrative aspects, as shown in FIGS. 3A and 3B, LS circuitry 362 and LS circuitry 364 may be configured to provide first LS outputs 363 and second LS outputs 365, respectively.

In some demonstrative aspects, as shown in FIG. 3A, the high-power LS output may include a first LS output signal 381 at a first output node 382 of the LS circuitry 362, for example, based on the positive input signal 311; and a second LS output 383 signal at a second output node 384 of the LS circuitry 362, for example, based on the positive input signal 311.

In some demonstrative aspects, as shown in FIG. 3A, LS output signal 381 may be in a first LS output voltage range between the VSS voltage level and the Vd,max voltage level, and LS output signal 383 may be in a second LS output voltage range between the VDD voltage level, e.g., VDD=3×Vd,max, and the 2×Vd,max voltage level.

In some demonstrative aspects, as shown in FIG. 3A, LS output signal 381 and LS output signal 383 may have a same size, which may be equal to a size of the low-power voltage domain, e.g., between the VSS and the Vd,max voltage levels.

In some demonstrative aspects, as shown in FIG. 3A, LS output signal 381 may be provided by a transistor 380.

In some demonstrative aspects, as shown in FIG. 3A, a gate of transistor 380 may be electrically coupled to a voltage supply of Vd,max, and a source of transistor 380 may be connected to a voltage supply of Vss. Accordingly, a maximal voltage of LS output signal 381 may include the voltage Vd,max, and a minimal voltage of LS output signal 381 may include the VSS voltage level.

In some demonstrative aspects, as shown in FIG. 3A, LS output signal 383 may be provided by a transistor 388.

In some demonstrative aspects, as shown in FIG. 3A, a source of transistor 388 may be connected to a voltage supply of VDD including the 3×Vd,max voltage level, and a drain of transistor 388 may be electrically coupled to a voltage supply of the 2×Vd,max voltage level.

Accordingly, a maximal voltage of LS output signal 383 may include the 3×Vd,max voltage level, and a minimal voltage of LS output signal 388 may include the 2×Vd,max voltage level.

In some demonstrative aspects, the output signals of the LS 360, e.g., LS output signal 381 and/or 383 may be the input signals to PA circuitry 326 (FIG. 3C), e.g., as described below.

In some demonstrative aspects, as shown in FIG. 3C, LS output signal 381 may be provided as an input to an input node 385 of PA circuitry 326.

For example, shown in FIG. 3A, LS output signal 381 may be provided, for example, by output node 382, as an input to a first input node of PA circuitry 322.

For example, shown in FIG. 3B, an LS output signal 391 may be provided, for example, by an output node 393 as an input to a first input node of PA circuitry 324.

In some demonstrative aspects, as shown in FIG. 3C, LS output signal 383 may be provided as an input to an input node 386 of PA circuitry 326.

For example, shown in FIG. 3A, LS output signal 383 may be provided, for example, by output node 384, as an input to a second input node of PA circuitry 322.

For example, shown in FIG. 3B, an LS output signal 395 may be provided, for example, by an output node 399, as an input to a second input node of PA circuitry 324. In some demonstrative aspects, as shown in FIG. 3C, PA circuitry 326 may include an output node 388 configured to provide a high-power output signal 314, e.g., at the high power mode. For example, high-power output signal 314 may include positive high-power output signal 312 for PA circuitry 322. For example, high-power output signal 314 may include negative high-power output signal 313, e.g., for PA circuitry 324.

In some demonstrative aspects, as shown in FIG. 3C, PA circuitry 326 may include a first plurality of transistors 392 connected in series between a VSS supply voltage and the output node 388.

In some demonstrative aspects, as shown in FIG. 3C, the first plurality of transistors 392 may include three transistors, e.g., including a transistor, denoted T9, a transistor, denoted T8, and/or a transistor, denoted T7.

In other aspects, the first plurality of transistors 392 may include any other additional and/or alternative transistors.

In some demonstrative aspects, as shown in FIG. 3C, a gate of the transistor T9 of the first plurality of transistors 392 may be connected to the first input node 385. Accordingly, the gate of the transistor T9 may receive the LS output signal 381, e.g., at the high power mode.

In some demonstrative aspects, as shown in FIG. 3C, PA circuitry 326 may include a second plurality of transistors 394 connected in series between a VDD supply voltage, e.g., including the 3×Vd,max voltage level, and the output node 388.

In some demonstrative aspects, as shown in FIG. 3C, the second plurality of transistors 394 may include three transistors, e.g., including a transistor, denoted T4, a transistor, denoted T5, and/or a transistor, denoted T6.

In other aspects, the second plurality of transistors 394 may include any other additional and/or alternative transistors.

In some demonstrative aspects, as shown in FIG. 3C, a gate of the transistor T4 of the second plurality of transistors 394 may be connected to the second input node 386.

Accordingly, the gate of the transistor T4 may receive the LS output signal 383, e.g., at the high power mode.

In some demonstrative aspects, as shown in FIG. 3C, PA circuitry 326 may be configured to provide the high-power output signal 314 at the high power mode, for example, based on the first LS output signal 381 at the first input node 385, and/or the second LS output signal 383 at the second input node 386.

In some demonstrative aspects, as shown in FIG. 3C, the first plurality of transistors 392 and/or the second plurality of transistors 324 may be configured to provide the 3×Vd,max voltage level at the output node 388, e.g., at the high power mode, for example, based on the minimal voltage, e.g., the VSS voltage level, of the first LS output signal 381 at the first input node 385, and/or based on the minimal voltage, e.g., the 2×Vd,max voltage level, of the second LS output signal 383 at the second input node 386.

In some demonstrative aspects, as shown in FIG. 3C, when the 2×Vd,max voltage level is applied to the gate of the transistor T4, e.g., by LS output signal 383, the transistor T4 may be at an open state, which may allow to transfer the 3×Vd,max voltage level voltage to output node 388, e.g., via a source of the transistor T5, and a source of the transistor T6.

In some demonstrative aspects, as shown in FIG. 3C, when the VSS voltage level is applied to the gate of the transistor T9, e.g., by LS output signal 381, the transistor T9 may be at a closed state. For example, the VSS voltage level applied to the source of the transistor T9 may not allow to transfer the VSS voltage level to output node 388, e.g., via the transistor T6.

In some demonstrative aspects, as shown in FIG. 3C, the first plurality of transistors 392 and/or the second plurality of transistors 394 may be configured to provide the VSS voltage level at the output node 388, for example, based on the maximal voltage, e.g., the Vd,max voltage level, of the first LS output signal 381 at the first input node 385, and based on the maximal voltage, e.g., the 3×Vd,max voltage level, of the second LS output signal 383 at the second input node 386.

In some demonstrative aspects, as shown in FIG. 3C, the transistor T4 may be at a closed state when the 3×Vd,max voltage level is applied to the gate of the transistor T4, e.g., by LS output signal 383. for example, since the 3×Vd,max voltage level is applied to the source of the transistor T4, and may not allow to transfer the 3×Vd,max voltage level to output node 388.

In some demonstrative aspects, as shown in FIG. 3C, when the Vd,max voltage is applied to the gate of the transistor T9, e.g., by LS output signal 381, the transistor T9 may be at an open state, which may allow to transfer the VSS voltage level to output node 388, e.g., via a source of the transistor T8, and a source of the transistor T7.

In some demonstrative aspects, as shown in FIG. 3C, PA circuitry 326 may include a third plurality of transistors 396 connected in series between a VDD voltage, e.g., including the Vd,max voltage level, and a transistor node 397 between the transistor T5 and the transistor T6 of the plurality of transistors 394.

In some demonstrative aspects, as shown in FIG. 3C, the third plurality of transistors 396 may include two transistors, e.g., including a transistor, denoted T1, and/or a transistor, denoted T2.

In other aspects, the third plurality of transistors 396 may include any other additional and/or alternative transistors.

In some demonstrative aspects, as shown in FIG. 3C, when the Vd,max voltage level is applied to the gate of the transistor T1 of the plurality of transistors 396, the transistor T1 may be at a closed state, which may not allow to transfer the Vd,max voltage to transistor node 397.

Accordingly, a branch of PA circuitry 326 including the transistor T1, and the transistor T2, may be at an off state.

In some demonstrative aspects, as shown in FIG. 3C, PA circuitry 326 may include buffer circuitry 340, which may be implemented, for example, as a "high Z buffer". For example, buffer circuitry 130 (FIG. 1) may include one or more elements of include buffer circuitry 340, and/or may perform one or more operations of buffer circuitry 340.

In some demonstrative aspects, as shown in FIG. 3C, buffer circuitry 340 may be connected to a gate of the transistor T7 of the first plurality transistors 392, and/or to a gate of the transistor T6 of the second plurality of transistors 394.

In some demonstrative aspects, buffer circuitry 340 may be operable at the high power mode as a high-impedance capacitor, for example, to apply a high-impedance capacitance to the gate of the transistor T7 and/or to the gate of the transistor T6, e.g., as described below.

In some demonstrative aspects, as shown in FIG. 3C, buffer circuitry 340 may include a first plurality of buffer transistors 345 connected in series between a VDD supply voltage, e.g., including the Vd,max voltage level, and a buffer output node 336 of the buffer circuitry 340.

In some demonstrative aspects, as shown in FIG. 3C, the first plurality of buffer transistors 345 may include two transistors, e.g., including a transistor, denoted T17, and/or a transistor, denoted T18.

In other aspects, the first plurality of buffer transistors 345 may include any other additional and/or alternative transistors.

In some demonstrative aspects, as shown in FIG. 3C, buffer circuitry 340 may include a second plurality of buffer transistors 347 connected in series between a VSS supply voltage and the buffer output node 336.

In some demonstrative aspects, as shown in FIG. 3C, the second plurality of buffer transistors 347 may include two transistors, e.g., including a transistor, denoted T19, and/or a transistor, denoted T20.

In other aspects, the second plurality of buffer transistors 347 may include any other additional and/or alternative transistors.

In some demonstrative aspects, as shown in FIG. 3C, the transistor T17 may be at a closed state, for example, when the Vd,max voltage level is applied to a gate of the transistor T17 of the first plurality of buffer transistors 345, e.g., as the Vd,max voltage is applied to a source of the transistor T17.

In some demonstrative aspects, as shown in FIG. 3C, the transistor T20 may be at the closed state, for example, when the VSS voltage level is applied to a gate of the transistor T20 of the second plurality of buffer transistors 347, e.g., as the VSS voltage is applied to a source of the transistor T20.

In some demonstrative aspects, the closed state of the transistors T20 and T17 may support in applying the high-impedance capacitance to the gate of the transistor T7 and/or to the gate of the transistor T6, e.g., as no current may flow between the VDD supply voltage and the VSS supply voltage.

In some demonstrative aspects, as shown in FIG. 3C, PA circuitry 326 may be configured to receive two maximal supply voltages, for example, to support the high and low power modes, e.g., as described below.

In some demonstrative aspects, as shown in FIG. 3C, PA circuitry 326 may be configured to receive the 3×Vd,max supply voltage via the plurality of transistors 394, for example, to support the high power mode.

In some demonstrative aspects, as shown in FIG. 3C, PA circuitry 326 may be configured to receive the Vd,max supply voltage via the plurality of transistors 392, for example, to support the low power mode, e.g., as described below with reference to FIG. 4C.

In some demonstrative aspects, PA circuitry 326 may be implemented to provide a technical solution to support the 3×Vd,max supply voltage and the Vd,max supply voltage, for example, while avoiding and/or mitigating severe reliability issues, e.g., compared to other multi-mode PA architectures.

In some demonstrative aspects, a supply ratio of three, e.g., between the 3×Vd,max supply voltage and the Vd,max supply voltage, may be implemented, for example, to reduce, e.g., as required, a maximum output power, e.g., by 20 log 10(3) ~ 9.5 [dB], between the high power mode and the low power mode.

In some demonstrative aspects, PA circuitry 326 may be implemented to provide a technical solution, which may avoid changes to an output net, and, accordingly, may support keeping a same matching network, and/or achieving efficient boosting in the high power mode and/or the low power mode.

In some demonstrative aspects, as shown in FIG. 3C, the transistors T17, T18, T19, T20, T21 and/or T22 of buffer circuitry 340 may be operated as capacitive feedback for the high power mode, e.g., as described above, and/or as a pre-driver stage for the low power mode, e.g., as described below.

In some demonstrative aspects, sizing of buffer circuitry 340 may be designed such that a capacitance ratio between the transistors T18 and T19 may be based on the capacitance ratio between the transistors T6 and T7, for example, to support proper capacitive feedback sizing.

In some demonstrative aspects, the capacitance ratio between the transistors T18 and T19 may be about two times the capacitance ratio between the transistors T6 and T7, e.g., T18/T19=2×T6/T7.

In other aspects, any other capacitance ratio between the transistors T18 and T19 and/or capacitance ratio between the transistors T6 and T7 may be implemented.

In some demonstrative aspects, as shown in FIG. 3C, at the high power mode, the output signals of the LS 360 may drive the transistors T9 and T4 of PA circuitry 326, e.g., as an output driver stack-up, for example, while buffer circuitry 340 may be in an off state, for example, to present a required capacitive feedback.

In some demonstrative aspects, as shown in FIG. 3C, PA circuitry 326 may include a plurality of transistors, e.g., including a transistor, denoted T11, a transistor, denoted T14, a transistor, denoted T10, and/or a transistor, denoted T12.

In some demonstrative aspects, transistor T11 and/or transistor T14 may be operable as pull_up/pull_down transistors, e.g., as a weak feedback.

In some demonstrative aspects, transistor T10 and/or transistor T12 may be operable to connect or disconnect the weak feedback, e.g., between the high power mode and the low power mode.

In some demonstrative aspects, the transistor T1 in the plurality of transistors 396 may be at the off-state, e.g., at the high power mode, and may be operable as a low supply feed switch, for example, in the low-power mode, e.g., as described below.

In some demonstrative aspects, the transistor T2 in the plurality of transistors 396 may be configured to keep the transistor T1 and/or the transistor T2 under reliability constraints, for example, to assure that Vds, Vgs, Vgd<Vd,max for the transistors, e.g., during the high power mode, where a drain of the transistor T5 and a source of the transistor T6 may be toggled between the Vd,max voltage level and the 3×Vd,max voltage level.

Figure 4A:
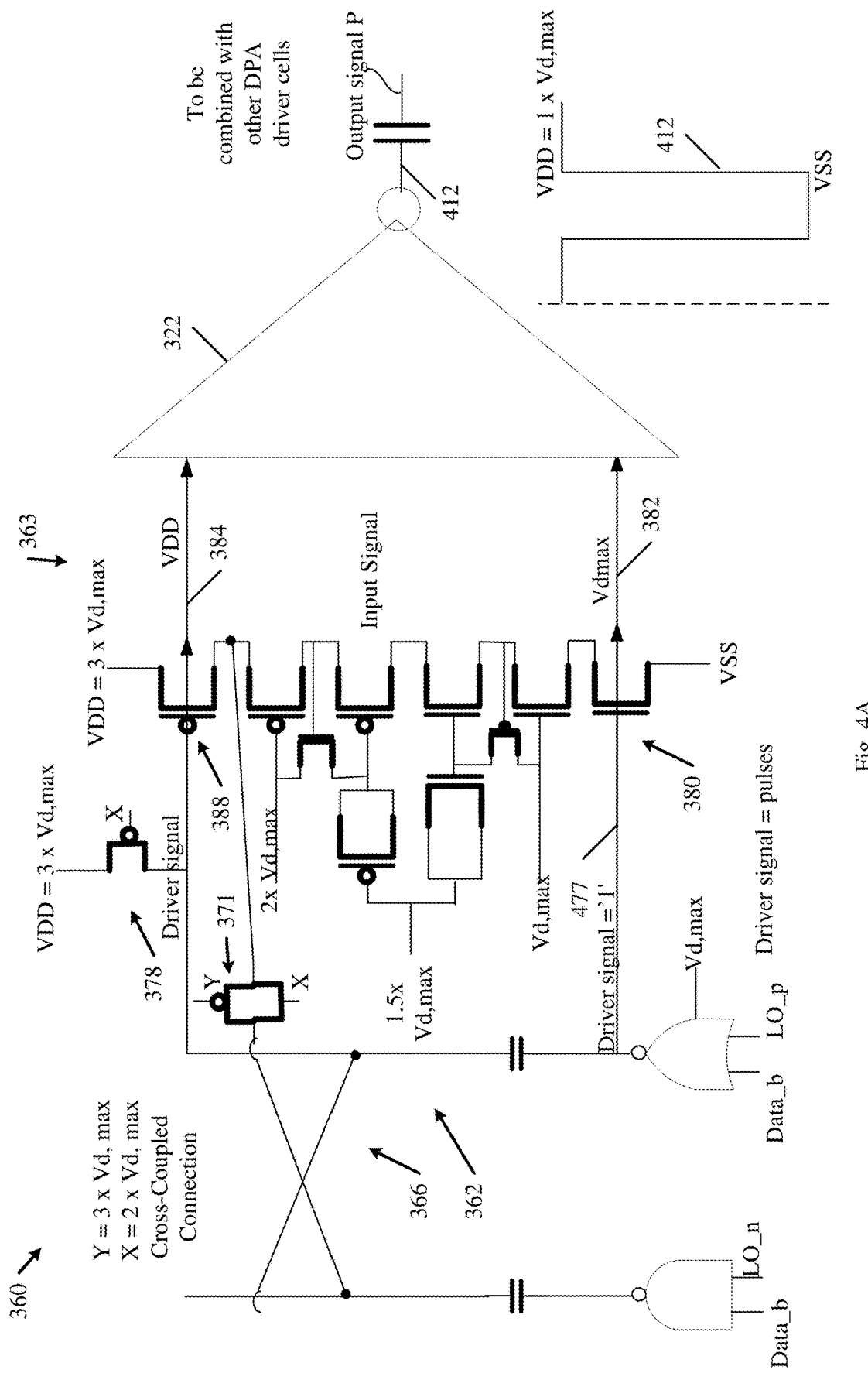
FIGS. 4A, 4B, and 4C are schematic illustrations of the multi-mode power amplifier of FIGS. 3A, 3B, and 3C at a low-power mode, in accordance with some demonstrative aspects.
Figure 4B:
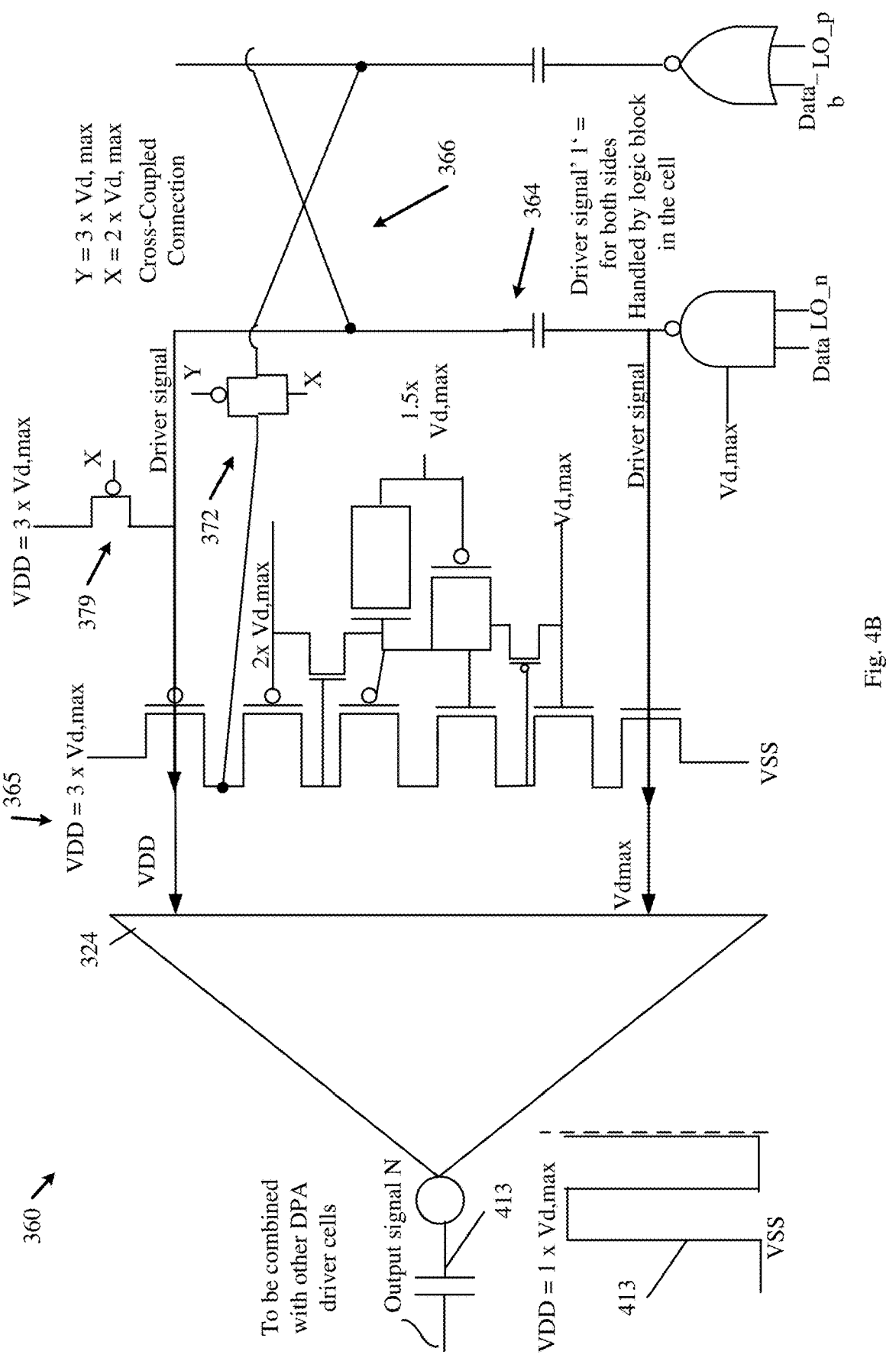
Figure 4C:
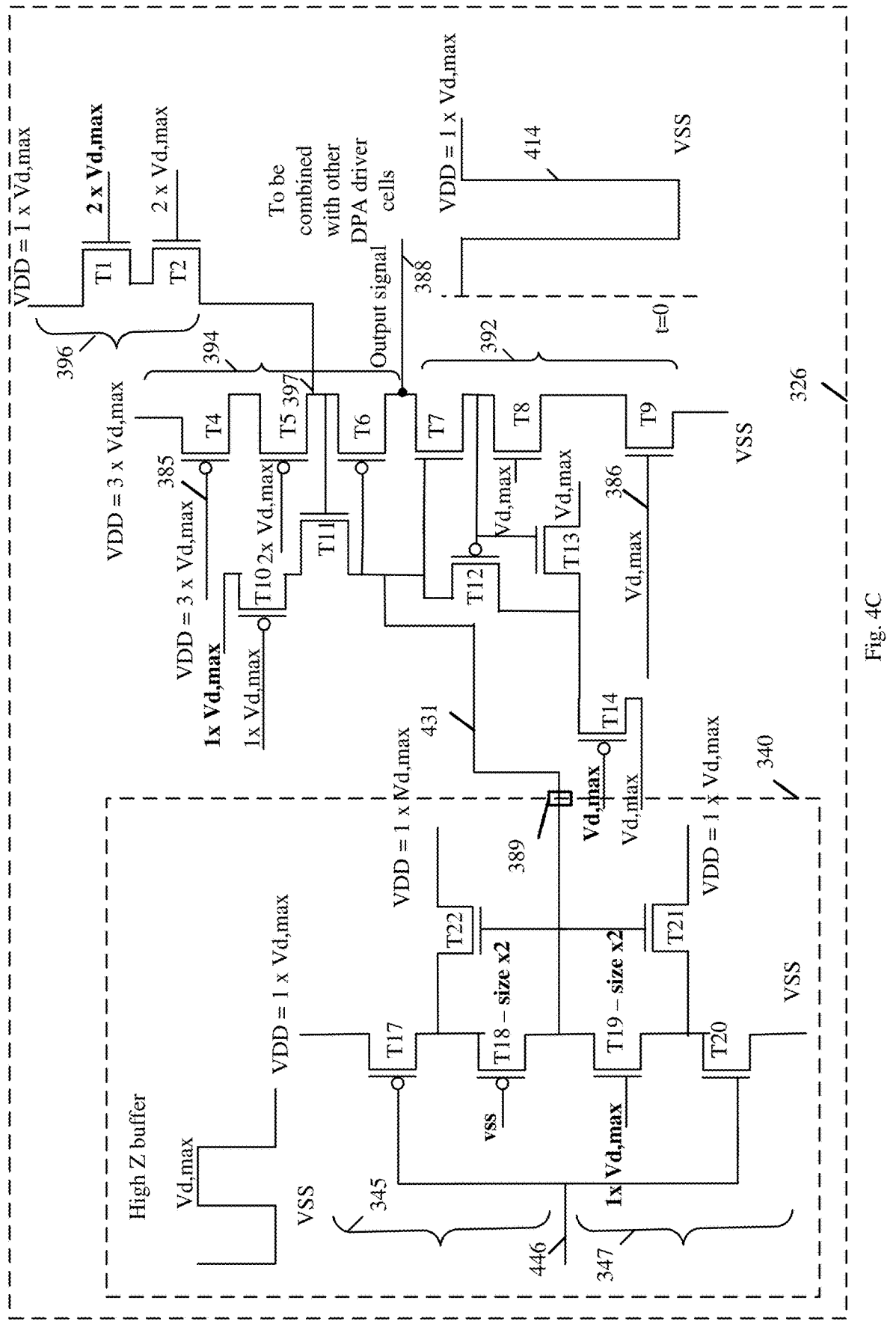

Reference is made to FIG. 4A, FIG. 4B, and FIG. 4C, which schematically illustrate the multi-mode power amplifier 310 at a low power mode, in accordance with some demonstrative aspects.

In some demonstrative aspects, multi-mode power amplifier 310 may be switchable between the high power mode and the low power mode, for example, by the controller, e.g., controller 250 (FIG. 2), for example, to generate a positive low-power output signal 412 and a negative low power output signal 413, e.g., at the low-power mode.

In some demonstrative aspects, the controller, e.g., controller 250 (FIG. 2), may switch the multi-mode power amplifier 310 between the high power mode and the low power mode, for example, by switching voltage levels of one or more supply voltages of multi-mode power amplifier 310, e.g., as describe below.

In some demonstrative aspects, LS 360 may be configured to provide low-power LS output at the low power mode, e.g., as described below.

In some demonstrative aspects, as shown in FIG. 4A and FIG. 4B, at the low power mode, the cross-coupling connection 366 may be operable at the decoupling mode, for example, to electrically decouple between the first LS circuitry 362 and the second LS circuitry 364. For example, the first LS circuitry 362 and the second LS circuitry 364 may be electrically decoupled to provide the low power LS output of the LS 360, for example, as bias voltages.

In some demonstrative aspects, LS 360 may be configured to provide the first LS outputs 363 and the second LS outputs 365, as bias voltages.

In some demonstrative aspects, as shown in FIGS. 4A and 4B, cross-coupling connection 366 may be configured to electrically decouple between the first LS circuitry 362 and the second LS circuitry 364, for example, by the first switch 371 in LS circuitry 362, and the second switch 372 in LS circuitry 364.

In some demonstrative aspects, as shown in FIGS. 4A and 4B, switch 371 and/or switch 372 may be at the closed state, for example, as there may be a negative difference between the gate of the NMOS transistors and the gate of the PMOS transistors.

In some demonstrative aspects, as shown in FIG. 4A, the input X to the gate of the NMOS transistor of switch 371 may receive the 2×Vd,max voltage level, and the input Y to the gate of the PMOS transistor of switch 371 may receive the 3×Vd,max voltage level. Accordingly, switch 371 may be at the closed state.

In some demonstrative aspects, as shown in FIG. 4B, the input X to the gate of the NMOS transistor of switch 372 may receive the 2×Vd,max voltage level, and the input Y to the gate of the PMOS transistor of switch 372 may receive the 3×Vd,max voltage level. Accordingly, switch 372 may be at the closed state.

In some demonstrative aspects, as shown in FIGS. 4A and 4B, LS circuitry 364 and LS circuitry 362 may have a same architecture and/or may include substantially similar circuitry, for example, to provide the LS low power output.

In some demonstrative aspects, the low power LS output may include the voltage level Vd,max at the first output node 382, and/or the voltage level 3×Vd,max at the second output node 384.

In some demonstrative aspects, as shown in FIG. 4A, first output node 382 may provide the LS output voltage Vd,max via a gate of the transistor 380.

In some demonstrative aspects, as shown in FIG. 4A, second output node 384 may provide the LS output voltage 3×Vd,max via the gate of the transistor 388.

In some demonstrative aspects, as shown in FIG. 4A, the gate of transistor 378 may receive the input X including the 2×Vd,max voltage level. Accordingly, transistor 378 may be at the open state, e.g., when the source of transistor 378 receives the 3×Vd,max voltage level.

In some demonstrative aspects, as shown in FIGS. 4A, the gate of transistor 388 may be driven by a drain of the transistor 378. Accordingly, the gate of transistor 388 may provide the 3×Vd,max voltage level to output node 384.

In some demonstrative aspects, as shown in FIG. 4A, the gate of transistor 380 may be driven by a driver signal 477, which may be controlled by a controller, e.g., controller 250 (FIG. 2).

In some demonstrative aspects, as shown in FIG. 4A, driver signal 477 may include a voltage level of the Vd,max voltage level, e.g., 1V. Accordingly, the gate of transistor 388 may provide the Vd,max voltage level to output node 382.

In some demonstrative aspects, shown in FIGS. 4A, 4B and 4C, the Vd,max voltage level may be provided, for example, by output node 382, to the first input node of PA circuitry 322 and/or PA circuitry 324, e.g., to the input node 385 of PA circuitry 326.

In some demonstrative aspects, shown in FIGS. 4A, 4B and 4C, the 3×Vd,max voltage level may be provided, for example, by output node 384, to the second input node of PA circuitry 322 and/or PA circuitry 324, e.g., to the input node 386 of PA circuitry 326.

In some demonstrative aspects, as shown in FIG. 4C, output node 388 may be configured to provide a low-power output signal 414 at the low power mode. For example, the low-power output signal 414 may include positive low-power output signal 412 at PA circuitry 322, and/or negative low-power output signal 413 at PA circuitry 324.

In some demonstrative aspects, as shown in FIG. 4C, input node 385 may be connected to the gate of the transistor T4. Accordingly, the gate of the transistor T4 may receive the 3×Vd,max voltage level at the low power mode.

In some demonstrative aspects, as shown in FIG. 4C, the transistor T4 may be at a closed state, for example, when the source of the transistor T9 receives the 3×Vd,max voltage level.

Accordingly, a branch including the transistors T4 and T5 may be at an off state, e.g., at the low power mode.

In some demonstrative aspects, as shown in FIG. 4C, input node 386 may be connected to the gate of the transistor T9. Accordingly, the gate of the transistor T9 may receive the voltage level Vd,max, e.g., at the low power mode.

In some demonstrative aspects, as shown in FIG. 4C, gate voltages of the transistor T4 and the transistor T9, e.g., of both of the P side PA circuitry 322 and the N side PA circuitry 324, may be at common bias voltages.

In some demonstrative aspects, as shown in FIG. 4C, the transistor T9 may be at an open state, for example, when the source of the transistor T9 receives the VSS voltage level.

Accordingly, transistor T9 may allow to transfer the VSS to output node 388, e.g., via the transistor T8 and the transistor T7.

In some demonstrative aspects, as shown in FIG. 4C, PA circuitry 326 may include an input node 446 to input the input signal 311, e.g., at the low power mode.

In some demonstrative aspects, as shown in FIG. 4C, PA circuitry 326 may be configured to provide the low-power output signal 414, for example, based on the input signal 311 at the input node 446, the Vd,max voltage level at the first input node 385, for example, from output node 382, and the 3×Vd,max voltage level at the second input node 386, for example, from output node 384.

In some demonstrative aspects, as shown in FIG. 4C, PA circuitry 326 may be configured to provide the Vd,max voltage level at the output node 388, for example, based on a minimal voltage, e.g., the VSS voltage level, of the input signal 311 at the input node 446.

In some demonstrative aspects, as shown in FIG. 4C, PA circuitry 326 may be configured to provide the VSS voltage level at the output node 388, for example, based on a maximal voltage, e.g., the Vd,max voltage level, of the input signal 311 at the input node 446.

In some demonstrative aspects, as shown in FIG. 4C, buffer circuitry 340 may be configured to provide a buffered input signal 431 to a gate of the transistor T6, and/or to a gate of the transistor T7.

In some demonstrative aspects, buffered input signal 431 may be based on the input signal 311.

In some demonstrative aspects, as shown in FIG. 4C, input node 446 may be connected to a gate of the transistor T17 of the first plurality of buffer transistors 345, and/or to a gate of the transistor T20 of the second plurality of buffer transistors 347.

In some demonstrative aspects, as shown in FIG. 4C, the transistor T17 may be at a closed state, for example, when the Vd,max voltage level of input signal 311 is applied to the gate of the transistor T17 and to the gate of the transistor T20, and the Vd,max voltage level is applied to the source of the transistor T17. This setting may not allow to transfer the Vd,max voltage level to an output node 389 of buffer circuitry 340.

In some demonstrative aspects, as shown in FIG. 4C, the transistor T20 may be at the open state, for example, when the Vd,max voltage level of input signal 311 is applied to the gate of the transistor T17 and to the gate of the transistor T20, and the VSS voltage level is applied to the source of the transistor T20. This setting may allow to transfer the VSS voltage level to the output node 389 of buffer circuitry 340, e.g., via the transistor T19.

In some demonstrative aspects, as shown in FIG. 4C, the transistor T20 may be at a closed state, for example, when the VSS voltage level of input signal 311 is applied to the gate of the transistor T17 and to the gate of the transistor T20, and the VSS voltage level is applied to the source of the transistor T20. This setting may not allow to transfer the VSS voltage level to the output node 389 of buffer circuitry 340.

In some demonstrative aspects, as shown in FIG. 4C, the transistor T17 may be at the open state, for example, when the VSS voltage level of input signal 311 is applied to the gate of the transistor T17 and to the gate of the transistor T20, and the Vd,max voltage level is applied to the source of the transistor T17. This setting may allow to transfer the Vd,max voltage level to the output node 389 of buffer circuitry 340, e.g., via the transistor T18.

In some demonstrative aspects, as shown in FIG. 4C, PA circuitry 326 may be configured to provide the low-power output signal 414, for example, based on the buffered input signal 431.

In some demonstrative aspects, as shown in FIG. 4C, the first plurality of transistors 392 and/or the third plurality of transistors 396 may be operable at the low power mode to provide the Vd,max voltage level at the output node 388, for example, based on the minimal voltage, e.g., the VSS voltage level, of the buffered input signal 431.

In some demonstrative aspects, as shown in FIG. 4C, the first plurality of transistors 392 and/or the third plurality of transistors 396 may be operable at the low power mode to provide the VSS voltage level at the output node 388, for example, based on the maximal voltage, e.g., the Vd,max voltage level, of the buffered input signal 431.

In some demonstrative aspects, as shown in FIG. 4C, the transistor T6 may be at a closed state, for example, when the Vd,max voltage level of the buffered input signal 431 is applied to the gate of the transistor T6 and to the gate of the transistor T7, and the Vd,max voltage level is applied to the source of the transistor T6, e.g., via the transistor T1 and the transistor T2. This setting may not allow to transfer the Vd,max voltage level to output node 388.

In some demonstrative aspects, as shown in FIG. 4C, the transistor T7 may be at the open state, for example, when the Vd,max voltage level of the buffered input signal 431 is applied to the gate of the transistor T6 and to the gate of the transistor T7, and the VSS voltage level is applied to the drain of the transistor T6, e.g., via the transistor T9 and the transistor T8. This setting may allow to transfer the VSS voltage level to output node 388.

In some demonstrative aspects, as shown in FIG. 4C, the transistor T7 may be at a closed state, for example, when the VSS voltage level of the buffered input signal 431 is applied to the gate of the transistor T6 and to the gate of the transistor T7, and the VSS voltage level is applied to the drain of the transistor T7, e.g., via the transistor T8 and the transistor T9. This setting may not allow to transfer the VSS voltage level to output node 388.

In some demonstrative aspects, as shown in FIG. 4C, the transistor T6 may be at the open state, for example, when the VSS voltage level of the buffered input signal 431 is applied to the gate of the transistor T6 and to the gate of the transistor T7, and the Vd,max voltage level is applied to the source of the transistor T7, e.g., via the transistor T1 and the transistor T2. This setting may allow to transfer the Vd,max voltage level to output node 388.

In some demonstrative aspects, as shown in FIG. 4C, the transistor T1 in the plurality of transistors 396 may be configured as a low supply feed switch.

In some demonstrative aspects, as shown in FIG. 4C, a branch including the transistor T4 and the transistor T5 may be at an off state at the low power mode. Accordingly, a supply voltage of the low power mode, e.g., the Vd,max voltage level, may be driven via the transistor T1 and the transistor T2, to output node 388 via the transistor T6.

In some demonstrative aspects, as shown in FIG. 4C, a branch including the transistor T8 and the transistor T9 may be operable to provide the same functionality at the high power mode and at the low power mode, e.g., to provide the VSS voltage level to the output node 388.

In some demonstrative aspects, the branch including the transistor T1 and the transistor T2 may be connected to the transistor node 397, e.g., between a drain of the transistor T5 and a source of the transistor T6, for example, to reduce an impact on loading of an output net, e.g., between the low power mode and the high power mode, for example, such that the matching network may be as similar as possible at both the low power mode and the high power mode.

In some demonstrative aspects, the input signal 311 may be provided to input node 446 as a Modulated Local Oscillator (MOLO), which may be driven from the buffer circuitry 340 to the transistors T7 and T6 of PA circuitry 326.

In some demonstrative aspects, as shown in FIG. 4C, buffer circuitry 340 may be biased on the transistor T17, e.g., with the voltage level Vd,max, and/or the transistor T20, e.g., with the voltage level VSS, for example, to ensure the transistor T18 and/or the transistor T19 may drive the buffered input signal 431 rail to rail.

In some demonstrative aspects, as shown in FIG. 4C, the voltage level Vd,max may be applied to a gate and a source of the transistor T10, and/or a gate and a source the transistor T14, for example, to disconnect the transistor T11 and the transistor T12 at the low power mode, e.g., as feedback keepers, and/or to eliminate stress over PA circuitry 326.

Figure 5:
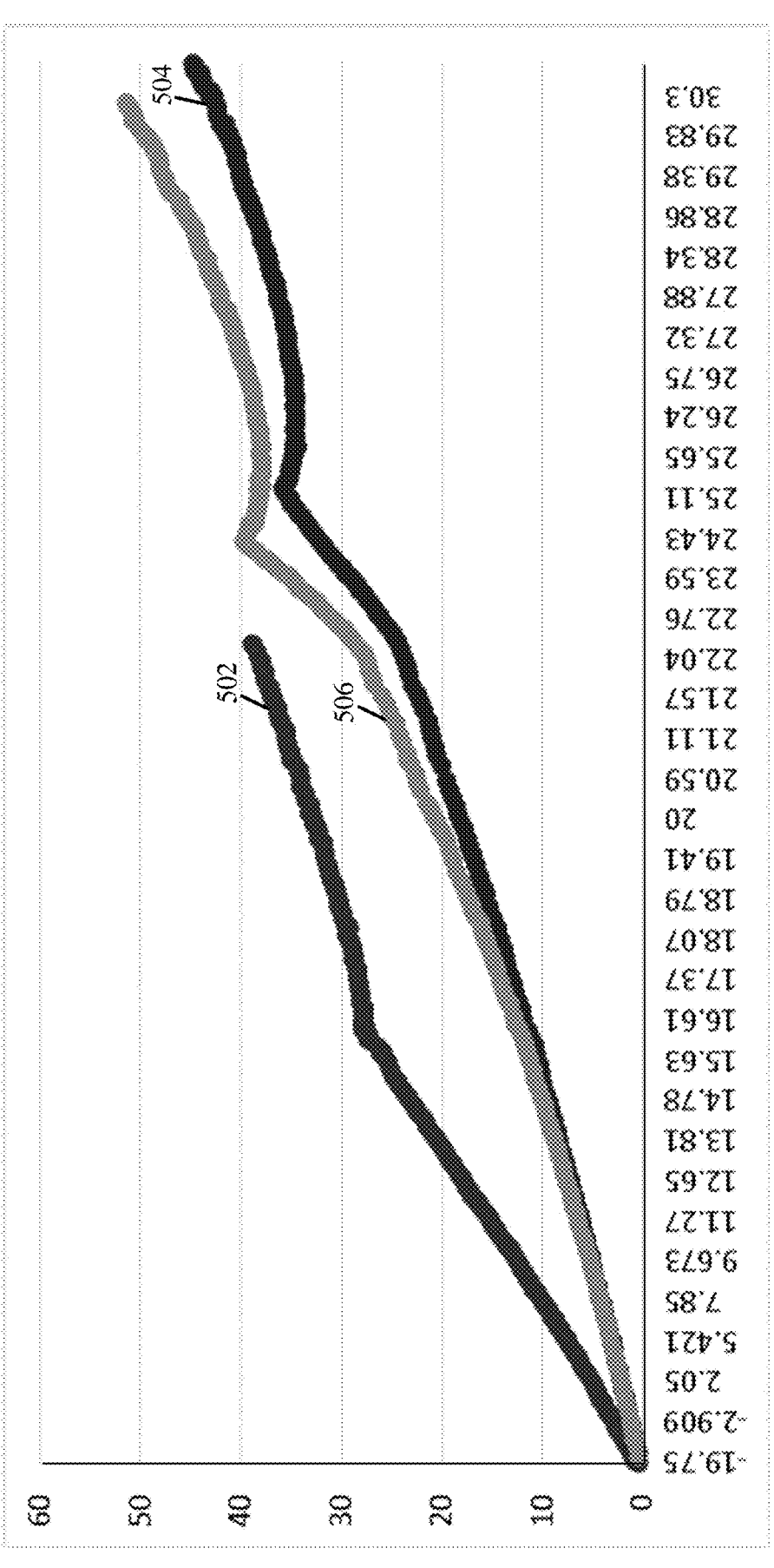
FIG. 5 is a schematic illustration of a graph depicting simulated Power Added Efficiency (PAE) results versus output power, in accordance with some demonstrative aspects.

Reference is made to FIG. 5, which schematically illustrates a graph 500 depicting simulated Power Added Efficiency (PAE) results versus output power, in accordance with some demonstrative aspects.

In some demonstrative aspects, as shown in FIG. 5, a curve 502 depicts a PAE of a power output of a multi-mode power amplifier at a low-power mode. In one example, curve 502 may simulate a PAE of a power output of the multi-mode power amplifier 310 (FIG. 3) at the low-power mode.

In some demonstrative aspects, as shown in FIG. 5, a curve 504 depicts a PAE of a power output of the multi-mode power amplifier at a high-power mode. In one example, curve 504 may simulate a PAE of a power output of the multi-mode power amplifier 310 (FIG. 3) at the high-power mode.

In some demonstrative aspects, as shown in FIG. 5, a curve 506 depicts a PAE of a power output of a single-mode high-power amplifier.

In some demonstrative aspects, the simulated curves of FIG. 5 may be based on a simulation using 256 thermometric cells arranged in two core configurations. For example, each core may include 128 cells. For example, the two core configurations may be combined using a same combiner model for the single mode high-power amplifier and the multi-mode power amplifier.

In some demonstrative aspects, as shown in FIG. 5, the PAE of the multi-mode power amplifier at the low-power mode may be improved, for example, by about −20%-~35%, e.g., compared to the PAE of the single mode high-power amplifier, for example, at a power output of about −20 dBm, which may be relevant for BT Peak Average Power Ratio (PAPR) signaling.

In some demonstrative aspects, as shown in FIG. 5, the PAE of the multi-mode power amplifier at the low-power mode may be improved, for example, by about ~10%-~25%, e.g., compared to the PAE of the single mode high-power amplifier, for example, at a power output of about −12 dBm, which may be relevant for WiFi PAPR signaling at low power.

In some demonstrative aspects, as shown in FIG. 5, there may be a slight loss in the PAE of the multi-mode power amplifier, e.g., a loss of about 6.5-3 dB with 2 DPAs and a switch.

However, this loss may be far better than other options and may be further improved, e.g., by tuning.

Figure 6:
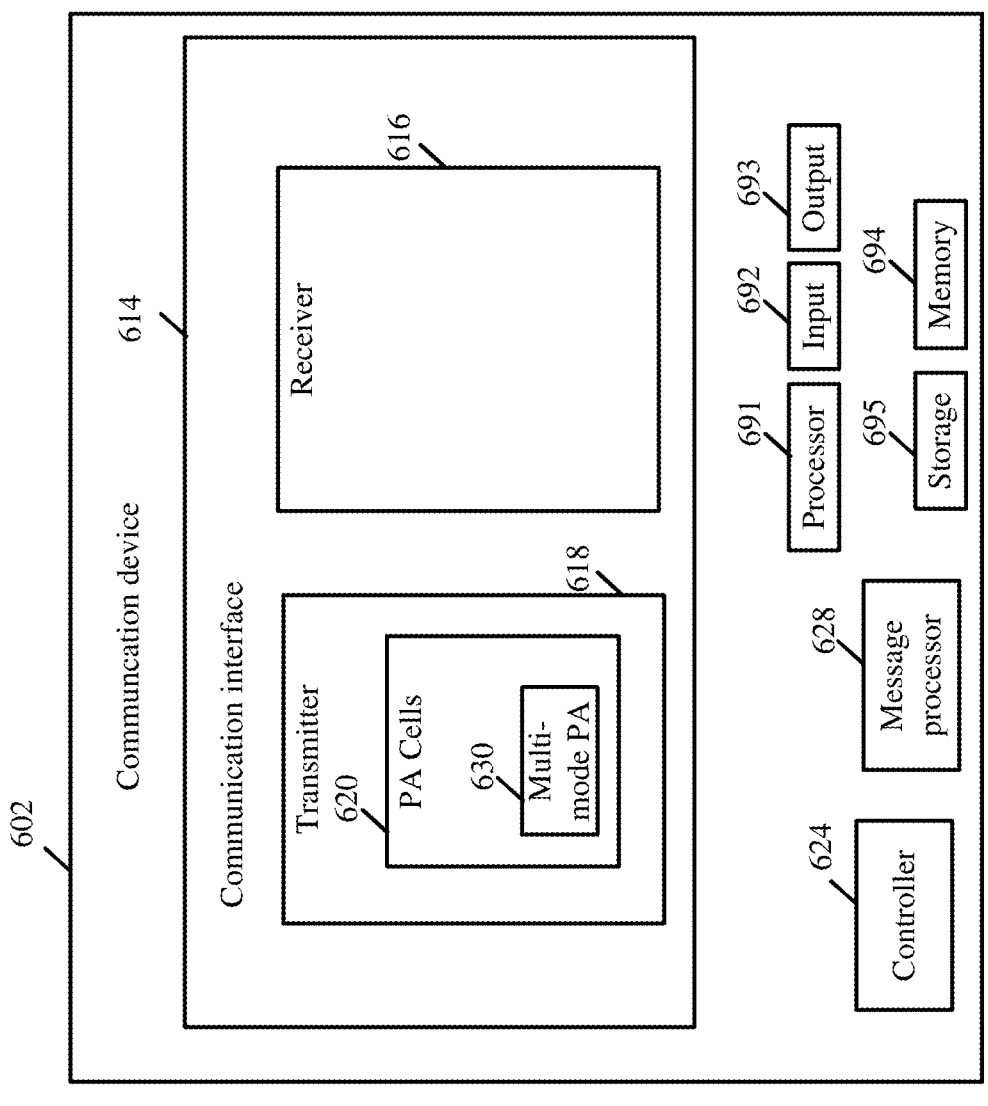
FIG. 6 is a schematic illustration of a communication device, in accordance with some demonstrative aspects.

Reference is now made to FIG. 6, which schematically illustrates a block diagram of a communication device 602, in accordance with some demonstrative aspects.

In some demonstrative aspects, communication device 602 may include a wireless communication device, and/or a wired communication device.

In some demonstrative aspects, communication device 602 may include, for example, a computing device, an MD, a STA, a PC, a desktop computer, a mobile computer, a laptop computer, an Ultrabook™ computer, a Smartphone, a gaming device, a peripheral device, a notebook computer, a tablet computer, a handheld computer, an Internet of Things (IoT) device, a sensor device, a handheld device, a wearable device, an on-board device, an off-board device, a consumer device, a vehicular device, a non-vehicular device, a mobile or portable device, a non-mobile or non-portable device, a mobile phone, a cellular telephone, a video device, an audio device, an A/V device, a video source, an audio source, a video sink, an audio sink, a Personal Media Player (PMP), a digital audio player, a data source, a data sink, a media player, or the like.

In some demonstrative aspects, communication device 602 may include, operate as, and/or perform the functionality of, a WLAN STA.

In some demonstrative aspects, communication device 602 may include, operate as, and/or perform the functionality of, a Wi-Fi STA.

In some demonstrative aspects, communication device 602 may include, operate as, and/or perform the functionality of, a BT device.

In some demonstrative aspects, communication device 602 may include, operate as, and/or perform the functionality of, one or more cellular client devices.

In other aspects, communication device 602 may include, operate as, and/or perform the functionality of any other type communication device, and/or any other device.

In some demonstrative aspects, communication device 602 may include, for example, one or more of a processor 691, an input unit 692, an output unit 693, a memory unit 694, and/or a storage unit 695. Communication device 602 may optionally include other suitable hardware components and/or software components. In some demonstrative aspects, some or all of the components of communication device 602 may be enclosed in a common housing or packaging, and may be interconnected or operably associated using one or more wired or wireless links. In other aspects, components of communication device 602 may be distributed among multiple or separate devices.

In some demonstrative aspects, processor 691 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 691 executes instructions, for example, of an Operating System (OS) of communication device 602 and/or of one or more suitable applications.

In some demonstrative aspects, input unit 692 may include, for example, a keyboard, a keypad, a mouse, a touch-screen, a touch-pad, a track-ball, a stylus, a microphone, or other suitable pointing device or input device. Output unit 693 includes, for example, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative aspects, memory unit 694 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 695 includes, for example, ahard disk drive, a Solid State Drive (SSD), and/or other suitable removable or non-removable storage units. Memory unit 694 and/or storage unit 695, for example, may store data processed by communication device 602.

In some demonstrative aspects, communication device 602 may be capable of communicating content, data, information and/or signals via a communication medium, e.g., a wireless medium or a wired medium.

In some demonstrative aspects, the wireless medium may include, for example, a radio channel, a cellular channel, an RF channel, a WiFi channel, a BT channel, an IR channel, and the like.

In some demonstrative aspects, communication device 602 may include one or more radios and or communication interfaces including circuitry and/or logic to perform communication between communication device 602 and/or one or more other devices. For example, communication device 602 may include at least one communication interface 614.

In some demonstrative aspects, communication interface 614 may include, for example, a WiFi radio, a cellular radio, a BT radio, and/or the like.

In some demonstrative aspects, communication interface 614 may include one or more receivers (Rx) including circuitry and/or logic to receive wireless communication signals, RF signals, frames, blocks, transmission streams, packets, messages, data items, and/or data. For example, communication interface 614 may include at least one receiver 616.

In some demonstrative aspects, communication interface 614 may include one or more transmitters (Tx) including circuitry and/or logic to transmit wireless communication signals, RF signals, frames, blocks, transmission streams, packets, messages, data items, and/or data. For example, communication interface 614 may include at least one transmitter 618.

In some demonstrative aspects, communication interface 614, transmitter 618, and/or receiver 616 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative aspects, transmitter 618 may include a plurality of PA cells 620, which may be configured to amplify an input signal to be transmitted to one or more other communication devices.

In some demonstrative aspects, a PA cell 620, e.g., each PA cell 620, may include a multi-mode PA 630. For example, multi-mode PA 630 may include one or more elements of multi-mode PA 130 (FIG. 1) and/or may perform one or more operations of multi-mode PA 130 (FIG. 1).

In some demonstrative aspects, multi-mode PA 630 be operable at a plurality of power modes, for example, to provide output signals in a plurality of voltage domains, e.g., as described above.

In some demonstrative aspects, multi-mode PA 630 be operable at a first power mode to provide an output signal in a first voltage domain, e.g., configured for a first communication technology. For example, the first voltage domain may be configured for BT communication according to a BT technology.

In some demonstrative aspects, multi-mode PA 630 be operable at a second power mode to provide an output signal in a second voltage domain, e.g., configured for a second communication technology. For example, the second voltage domain may be configured for WLAN, e.g., WiFi, communication according to a WLAN, e.g., WiFi, technology.

In some demonstrative aspects, the PA cells 620 may be implemented as part of circuitry supporting both the first communication technology and the second communication technology, e.g., in a same core.

In some demonstrative aspects, communication device 602 may include a controller 624 configured to perform and/or to trigger, cause, instruct and/or control communication device 602 to perform, one or more communications, to generate and/or communicate one or more messages and/or transmissions, and/or to perform one or more functionalities, operations and/or procedures between communication device 602 and/or one or more other devices, e.g., as described below.

For example, controller 624 may include one or more elements controller 250 (FIG. 2), and/or may perform one or more operations of controller 250 (FIG. 2).

In some demonstrative aspects, controller 624 may include, or may be implemented, partially or entirely, by circuitry and/or logic, e.g., one or more processors including circuitry and/or logic, memory circuitry and/or logic, Media-Access Control (MAC) circuitry and/or logic, Physical Layer (PHY) circuitry and/or logic, baseband (BB) circuitry and/or logic, a BB processor, a BB memory, Application Processor (AP) circuitry and/or logic, an AP processor, an AP memory, and/or any other circuitry and/or logic, configured to perform the functionality of controller 624.

Additionally or alternatively, one or more functionalities of controller 624 may be implemented by logic, which may be executed by a machine and/or one or more processors, e.g., as described below.

In one example, controller 624 may include circuitry and/or logic, for example, one or more processors including circuitry and/or logic, to cause, trigger and/or control a communication device 602, e.g., communication device 602, to perform one or more operations, communications and/or functionalities, e.g., as described herein. In one example, controller 624 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative aspects, device 602 may include a message processor 628 configured to generate, process and/or access one or more messages communicated by device 602.

In one example, message processor 628 may be configured to generate one or more messages to be transmitted by device 602, and/or message processor 628 may be configured to access and/or to process one or more messages received by device 602, e.g., as described below.

In some demonstrative aspects, message processor 628 may include, or may be implemented, partially or entirely, by circuitry and/or logic, e.g., one or more processors including circuitry and/or logic, memory circuitry and/or logic. Additionally or alternatively, one or more functionalities of message processor 628 may be implemented by logic, which may be executed by a machine and/or one or more processors, e.g., as described below.

In some demonstrative aspects, at least part of the functionality of message processor 628 may be implemented as part of controller 624.

In other aspects, the functionality of message processor 628 may be implemented as part of any other element of device 602.

In some demonstrative aspects, at least part of the functionality of communication interface 614, controller 624, and/or message processor 628 may be implemented by an integrated circuit, for example, a chip, e.g., a System on Chip (SoC). In one example, the chip or SoC may be configured to perform one or more functionalities of one or more functionalities of communication interface 614, controller 624, and one or more functionalities of message processor 628. In one example, communication interface 614, controller 624 and message processor 628 may be implemented as part of the chip or SoC.

In other aspects, communication interface 614, controller 624 and/or message processor 628 may be implemented by one or more additional or alternative elements of communication device 602.

Figure 7:
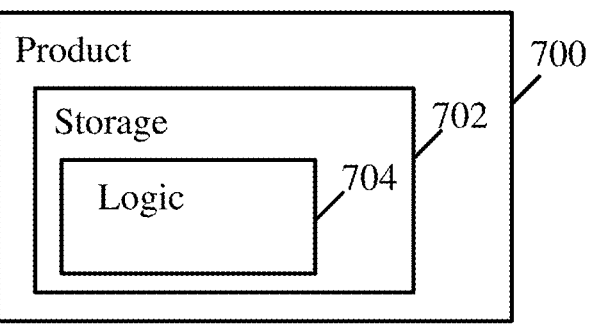
FIG. 7 is a schematic illustration of a product of manufacture, in accordance with some demonstrative aspects.

Reference is made to FIG. 7, which schematically illustrates a product of manufacture 700, in accordance with some demonstrative aspects. Product 700 may include one or more tangible computer-readable ("machine-readable") non-transitory storage media 702, which may include computer-executable instructions, e.g., implemented by logic 704, operable to, when executed by at least one computer processor, enable the at least one computer processor to implement one or more operations at device 602 (FIG. 6), multi-mode PA 110 (FIG. 1), multi-mode PA 210 (FIG. 2), and/or multi-mode PA 310 (FIG. 3); to cause device 602 (FIG. 6), multi-mode PA 110 (FIG. 1), multi-mode PA 210 (FIG. 2), and/or multi-mode PA 310 (FIG. 3) to perform, trigger and/or implement one or more operations and/or functionalities; and/or to perform, trigger and/or implement one or more operations and/or functionalities described with reference to the FIGS. 1-6, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative aspects, product 700 and/or machine-readable storage media 702 may include one or more types of computer-readable storage media capable of storing data, including volatile memory, non-volatile memory, removable or non-removable memory, erasable or non-erasable memory, writeable or re-writeable memory, and the like. For example, machine-readable storage media 702 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), flash memory (e.g., NOR or NAND flash memory), content addressable memory (CAM), polymer memory, phase-change memory, ferroelectric memory, silicon-oxide-nitride-oxide-silicon (SONOS) memory, a disk, a hard drive, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative aspects, logic 704 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative aspects, logic 704 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function.

The instructions may be implemented using any suitable high-level, low-level, object-oriented, visual, compiled and/or interpreted programming language, machine code, and the like.

EXAMPLES

The following examples pertain to further aspects.

Example 1 includes an apparatus comprising an input to receive an input signal in a first voltage domain; a multimode power amplifier switchable between a plurality of power modes to generate an output signal based on the input signal, wherein the multi-mode power amplifier is configured to provide the output signal in the first voltage domain at a first power mode, and to provide the output signal in a second voltage domain at a second power mode, wherein a maximal voltage of the second voltage domain is at least two times a maximal voltage of the first voltage domain; and an output to provide the output signal.

Example 2 includes the subject matter of Example 1, and optionally, wherein the multi-mode power amplifier comprises a Level Shifter (LS) configured to provide a first LS output at the first power mode, and a second LS output at the second power mode, the second LS output based on the input signal; and Power-Amplifier (PA) circuitry configured to generate the output signal at the first power mode based on the input signal and the first LS output, and to generate the output signal at the second power mode based on the second LS output.

Example 3 includes the subject matter of Example 2, and optionally, wherein the first LS output comprises a first LS output voltage at a first output node of the LS, and a second LS output voltage at a second output node of the LS.

Example 4 includes the subject matter of Example 3, and optionally, wherein the first LS output voltage comprises a first supply voltage of the LS, and the second LS output voltage comprises a second supply voltage of the LS.

Example 5 includes the subject matter of Example 3 or 4, and optionally, wherein the first LS output voltage comprises the maximal voltage of the first voltage domain, and the second LS output voltage comprises the maximal voltage of the second voltage domain.

Example 6 includes the subject matter of any one of Examples 2-5, and optionally, wherein the second LS output comprises a first LS output signal at a first output node of the LS based on the input signal, and a second LS output signal at a second output node of the LS based on the input signal.

Example 7 includes the subject matter of Example 6, and optionally, wherein the first LS output signal is in a first LS output voltage range, wherein the second LS output signal is in a second LS output voltage range different from the first LS output voltage range.

Example 8 includes the subject matter of Example 7, and optionally, wherein a size of the first LS output voltage range is equal to a size of the second LS output voltage range.

Example 9 includes the subject matter of Example 7 or 8, and optionally, wherein a size of the first LS output voltage range and a size of the second LS output voltage range are based on a size of a voltage range of the first voltage domain.

Example 10 includes the subject matter of any one of Examples 7-9, and optionally, wherein a maximal voltage of the first LS output voltage range comprises the maximal voltage of the first voltage domain, and a maximal voltage of the second LS output voltage range comprises the maximal voltage of the second voltage domain.

Example 11 includes the subject matter of any one of Examples 7-10, and optionally, wherein a minimal voltage of the first LS output voltage range comprises a minimal voltage of the first voltage domain, and a minimal voltage of the second LS output voltage range comprises a difference between the maximal voltage of the second voltage domain and a size of a voltage range of the first voltage domain.

Example 12 includes the subject matter of any one of Examples 2-11, and optionally, wherein the LS comprises first LS circuitry, second LS circuitry, and a cross-coupling connection switchable between a coupling mode and a de-coupling mode, wherein at the first power mode the cross-coupling connection is operable at the de-coupling mode to electrically decouple between the first LS circuitry and the second LS circuitry, wherein at the second power mode the cross-coupling connection is operable at the coupling mode to electrically couple between the first LS circuitry and the second LS circuitry to provide the second LS output as a differential LS output.

Example 13 includes the subject matter of any one of Examples 2-12, and optionally, wherein the PA circuitry comprises a first input node connected to a first output node of the LS; a second input node connected to a second output node of the LS; an output node to provide the output signal; a first plurality of transistors connected in series between a first PA voltage and the output node, wherein a gate of a transistor of the first plurality of transistors is connected to the first input node; and a second plurality of transistors connected in series between a second PA voltage and the output node, wherein a gate of a transistor of the second plurality of transistors is connected to the second input node.

Example 14 includes the subject matter of Example 13, and optionally, wherein the PA circuitry is configured to provide the output signal in the second voltage domain at the second power mode based on a first LS output signal at the first input node and a second LS output signal at the second input node.

Example 15 includes the subject matter of Example 14, and optionally, wherein the first and second pluralities of transistors are configured to provide the maximal voltage of the second power domain at the output node based on a minimal voltage of the first LS output signal at the first input node and a minimal voltage of the second LS output signal at the second input node, and to provide a minimal voltage of the second power domain at the output node based on a maximal voltage of the first LS output signal at the first input node and a maximal voltage of the second LS output signal at the second input node.

Example 16 includes the subject matter of any one of Examples 13-15, and optionally, wherein the PA circuitry comprises a third input node to input the input signal at the first power mode, wherein the PA circuitry is configured to provide the output signal in the first voltage domain at the first power mode based on the input signal at the third input node, a first LS output voltage at the first input node, and a second LS output voltage at the second input node.

Example 17 includes the subject matter of Example 16, and optionally, wherein the PA circuitry is configured to provide the maximal voltage of the first power domain at the output node based on a minimal voltage of the input signal at the third input node, and to provide a minimal voltage of the first power domain at the output node based on a maximal voltage of the input signal at the third input node.

Example 18 includes the subject matter of Example 16 or 17, and optionally, comprising buffer circuitry to provide a buffered input signal to a gate of a first transistor and to a gate of a second transistor at the first power mode, wherein the first transistor is in the first plurality of transistors and the second transistor is in the second plurality of transistors.

Example 19 includes the subject matter of Example 18, and optionally, wherein the buffer circuitry comprises a first plurality of buffer transistors connected in series between a third PA voltage and a buffer output node of the buffer circuitry, and a second plurality of buffer transistors connected in series between the second PA voltage and the buffer output node, wherein the third input node is connected to a gate of a transistor of the first plurality of buffer transistors and to a gate of a transistor of the second plurality of buffer transistors.

Example 20 includes the subject matter of Example 19, and optionally, wherein the third PA voltage comprises the maximal voltage of the first voltage domain.

Example 21 includes the subject matter of any one of Examples 18-20, and optionally, wherein the buffer circuitry is operable as a high-impedance capacitor to apply a high-impedance capacitance to the third input node.

Example 22 includes the subject matter of any one of Examples 18-21, and optionally, wherein the PA circuitry comprises a third plurality of transistors connected in series between a third PA voltage and a transistor node between first and second transistors in the first plurality of transistors, wherein at the first power mode the third plurality of transistors is to provide the third PA voltage to the transistor node at the second power mode.

Example 23 includes the subject matter of Example 22, and optionally, wherein the third PA voltage comprises the maximal voltage of the first voltage domain.

Example 24 includes the subject matter of any one of Examples 13-23, and optionally, wherein the first PA voltage comprises the maximal voltage of the second voltage domain, and the second PA voltage comprises a minimal voltage of the first voltage domain.

Example 25 includes the subject matter of any one of Examples 1-24, and optionally, wherein the maximal voltage of the second voltage domain is at least three times the maximal voltage of the first voltage domain.

Example 26 includes the subject matter of any one of Examples 1-25, and optionally, comprising a transmitter to transmit wireless communication signals, the transmitter comprising the multi-mode power amplifier.

Example 27 includes the subject matter of Example 26, and optionally, comprising one or more antennas connected to the transmitter, a memory, and a processor.

Example 28 comprises a wireless communication device comprising the apparatus of any one of Examples 1-27.

Example 29 comprises an apparatus comprising means for executing any of the described operations of Examples 1-27.

Example 30 comprises a product comprising one or more tangible computer-readable non-transitory storage media comprising instructions operable to, when executed by at least one processor, enable the at least one processor to cause a device to perform any of the described operations of Examples 1-27.

Example 31 comprises an apparatus comprising: a memory interface; and processing circuitry configured to: perform any of the described operations of Examples 1-27.

Example 32 comprises a method comprising any of the described operations of Examples 1-27.

Functions, operations, components and/or features described herein with reference to one or more aspects, may be combined with, or may be utilized in combination with, one or more other functions, operations, components and/or features described herein with reference to one or more other aspects, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
an input to receive an input signal in a first voltage domain;
a multi-mode power amplifier switchable between a plurality of power modes to generate an output signal based on the input signal, wherein the multi-mode power amplifier is configured to provide the output signal in the first voltage domain at a first power mode, and to provide the output signal in a second voltage domain at a second power mode, wherein a maximal voltage of the second voltage domain is at least two times a maximal voltage of the first voltage domain; and
an output to provide the output signal.

2. The apparatus of claim 1, wherein the multi-mode power amplifier comprises:
a Level Shifter (LS) configured to provide a first LS output at the first power mode, and a second LS output at the second power mode, wherein the second LS output is based on the input signal; and
Power-Amplifier (PA) circuitry configured to generate the output signal at the first power mode based on the input signal and the first LS output, and to generate the output signal at the second power mode based on the second LS output.

3. The apparatus of claim 2, wherein the first LS output comprises a first LS output voltage at a first output node of the LS, and a second LS output voltage at a second output node of the LS.

4. The apparatus of claim 3, wherein the first LS output voltage comprises the maximal voltage of the first voltage domain, and the second LS output voltage comprises the maximal voltage of the second voltage domain.

5. The apparatus of claim 2, wherein the second LS output comprises a first LS output signal at a first output node of the LS based on the input signal, and a second LS output signal at a second output node of the LS based on the input signal.

6. The apparatus of claim 5, wherein the first LS output signal is in a first LS output voltage range, wherein the second LS output signal is in a second LS output voltage range different from the first LS output voltage range.

7. The apparatus of claim 6, wherein a maximal voltage of the first LS output voltage range comprises the maximal voltage of the first voltage domain, and a maximal voltage of the second LS output voltage range comprises the maximal voltage of the second voltage domain.

8. The apparatus of claim 6, wherein a minimal voltage of the first LS output voltage range comprises a minimal voltage of the first voltage domain, and a minimal voltage of the second LS output voltage range comprises a difference between the maximal voltage of the second voltage domain and a size of a voltage range of the first voltage domain.

9. The apparatus of claim 2, wherein the LS comprises first LS circuitry, second LS circuitry, and a cross-coupling connection switchable between a coupling mode and a de-coupling mode, wherein at the first power mode the cross-coupling connection is operable at the de-coupling mode to electrically decouple between the first LS circuitry and the second LS circuitry, wherein at the second power mode the cross-coupling connection is operable at the coupling mode to electrically couple between the first LS circuitry and the second LS circuitry to provide the second LS output as a differential LS output.

10. The apparatus of claim 2, wherein the PA circuitry comprises:

a first input node connected to a first output node of the LS;

a second input node connected to a second output node of the LS;

an output node to provide the output signal;

a first plurality of transistors connected in series between a first PA voltage and the output node, wherein a gate of a transistor of the first plurality of transistors is connected to the first input node; and a second plurality of transistors connected in series between a second PA voltage and the output node, wherein a gate of a transistor of the second plurality of transistors is connected to the second input node.

11. The apparatus of claim 10, wherein the PA circuitry is configured to provide the output signal in the second voltage domain at the second power mode based on a first LS output signal at the first input node and a second LS output signal at the second input node.

12. The apparatus of claim 11, wherein the first and second pluralities of transistors are configured to provide the maximal voltage of the second power domain at the output node based on a minimal voltage of the first LS output signal at the first input node and a minimal voltage of the second LS output signal at the second input node, and to provide a minimal voltage of the second power domain at the output node based on a maximal voltage of the first LS output signal at the first input node and a maximal voltage of the second LS output signal at the second input node.

13. The apparatus of claim 10, wherein the PA circuitry comprises a third input node to input the input signal at the first power mode, wherein the PA circuitry is configured to provide the output signal in the first voltage domain at the first power mode based on the input signal at the third input node, a first LS output voltage at the first input node, and a second LS output voltage at the second input node.

14. The apparatus of claim 13, wherein the PA circuitry is configured to provide the maximal voltage of the first power domain at the output node based on a minimal voltage of the input signal at the third input node, and to provide a minimal voltage of the first power domain at the output node based on a maximal voltage of the input signal at the third input node.

15. The apparatus of claim 13 comprising buffer circuitry to provide a buffered input signal to a gate of a first transistor and to a gate of a second transistor at the first power mode, wherein the first transistor is in the first plurality of transistors and the second transistor is in the second plurality of transistors.

16. The apparatus of claim 15, wherein the buffer circuitry comprises a first plurality of buffer transistors connected in series between a third PA voltage and a buffer output node of the buffer circuitry, and a second plurality of buffer transistors connected in series between the second PA voltage and the buffer output node, wherein the third input node is connected to a gate of a transistor of the first plurality of buffer transistors and to a gate of a transistor of the second plurality of buffer transistors.

17. The apparatus of claim 15, wherein the buffer circuitry is operable as a high-impedance capacitor to apply a high-impedance capacitance to the third input node.

18. The apparatus of claim 15, wherein the PA circuitry comprises a third plurality of transistors connected in series between a third PA voltage and a transistor node between first and second transistors in the first plurality of transistors, wherein at the first power mode the third plurality of transistors is to provide the third PA voltage to the transistor node.

19. The apparatus of claim 10, wherein the first PA voltage comprises the maximal voltage of the second voltage domain, and the second PA voltage comprises a minimal voltage of the first voltage domain.

20. The apparatus of claim 1, wherein the maximal voltage of the second voltage domain is at least three times the maximal voltage of the first voltage domain.

21. The apparatus of claim 1 comprising a transmitter to transmit wireless communication signals, the transmitter comprising the multi-mode power amplifier.

22. A wireless communication device comprising:

a processor to process data;

one or more antennas; and a transmitter to transmit wireless communication signals via the one or more antennas based on the data, wherein the transmitter comprises:

a multi-mode power amplifier switchable between a plurality of power modes to generate an output signal based on an input in a first voltage domain, wherein the multi-mode power amplifier is configured to provide the output signal in the first voltage domain at a first power mode, and to provide the output signal in a second voltage domain at a second power mode, wherein a maximal voltage of the second voltage domain is at least two times a maximal voltage of the first voltage domain.

23. The wireless communication device of claim 22, wherein the multi-mode power amplifier comprises:

a Level Shifter (LS) configured to provide a first LS output at the first power mode, and a second LS output at the second power mode, wherein the second LS output is based on the input signal; and Power-Amplifier (PA) circuitry configured to generate the output signal at the first power mode based on the input signal and the first LS output, and to generate the output signal at the second power mode based on the second LS output.

24. An apparatus comprising:

a multi-mode power amplifier switchable between a plurality of power modes to generate an output signal based on an input in a first voltage domain, wherein the multi-mode power amplifier comprises:

means for providing the output signal in the first voltage domain at a first power mode; and means for providing the output signal in a second voltage domain at a second power mode, wherein a maximal voltage of the second voltage domain is at least two times a maximal voltage of the first voltage domain.

25. The apparatus of claim 24, wherein the multi-mode power amplifier comprises:

Level Shifter (LS) means for providing a first LS output at the first power mode, and a second LS output at the second power mode, wherein the second LS output is based on the input signal; and Power-Amplifier (PA) means for generating the output signal at the first power mode based on the input signal and the first LS output, and generating the output signal at the second power mode based on the second LS output.

* * * * *